US007473964B2

(12) United States Patent
Izumida

(10) Patent No.: US 7,473,964 B2
(45) Date of Patent: Jan. 6, 2009

(54) SEMICONDUCTOR DEVICE

(75) Inventor: Takashi Izumida, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 60 days.

(21) Appl. No.: 11/713,803

(22) Filed: Mar. 5, 2007

(65) Prior Publication Data

US 2007/0210355 A1    Sep. 13, 2007

(30) Foreign Application Priority Data

Mar. 6, 2006    (JP)    ............................. 2006-060347

(51) Int. Cl.
*H01L 29/94* (2006.01)
(52) U.S. Cl. ..................... 257/336; 257/327; 438/197
(58) Field of Classification Search ................ 257/327, 257/336; 438/197
See application file for complete search history.

(56) References Cited

U.S. PATENT DOCUMENTS

| 5,315,143 | A | 5/1994 | Tsuji | |
|---|---|---|---|---|
| 6,855,990 | B2 | 2/2005 | Yeo et al. | |
| 2005/0116218 | A1 | 6/2005 | Yang | |
| 2005/0202618 | A1* | 9/2005 | Yagishita | .................... 438/197 |
| 2006/0244051 | A1* | 11/2006 | Izumida et al. | .............. 257/327 |
| 2007/0114605 | A1* | 5/2007 | Dyer et al. | .................... 257/336 |
| 2007/0221956 | A1* | 9/2007 | Inaba | ......................... 257/197 |

FOREIGN PATENT DOCUMENTS

JP    2005-159362 A    6/2005

* cited by examiner

*Primary Examiner*—Fernando L Toledo
(74) *Attorney, Agent, or Firm*—Foley & Lardner LLP

(57) ABSTRACT

A semiconductor device includes: an insulating layer; a semiconductor fin protruding from the insulating layer, extending in a first direction parallel to a major surface of the insulating layer, and having a source region, a channel section, and a drain region arranged in the first direction; a gate electrode opposed at least to a side face of the channel section in the semiconductor fin and extending in a second direction that is substantially orthogonal to the first direction and parallel to the major surface of the insulating layer; an insulating film interposed between the semiconductor fin and the gate electrode; a spacer layer provided on the channel section; a sidewall insulating layer provided adjacent to a side face of the spacer layer substantially parallel to the second direction; and a stress liner. The stress liner covers the sidewall insulating layer and the spacer layer and has an intrinsic stress for distorting the semiconductor fin. The sidewall insulating layer has a thickness of 45 nanometers (nm) or more in the first direction, and the spacer layer has a height of 105 nanometers (nm) or more.

20 Claims, 42 Drawing Sheets

SEMICONDUCTOR DEVICE

CROSS-REFERENCE TO RELATED APPLICATIONS

This application is based upon and claims the benefit of priority from the prior Japanese Patent Application No. 2006-060347, filed on Mar. 6, 2006; the entire contents of which are incorporated herein by reference.

BACKGROUND OF THE INVENTION

1. Field of the Invention

This invention relates to a semiconductor device, and more particularly to a semiconductor device in which a stress is applied to the channel section to distort the crystal, thereby increasing the carrier mobility.

2. Background Art

In recent years, as the performance required for semiconductor transistors becomes higher, the structure thereof has been reconsidered. In the meantime, a multigate transistor having a three-dimensional structure called "FinFET" is proposed (see, e.g. JP 2005-159362A).

In a planar transistor, a source, a channel, and a drain are arranged in a planar configuration, and a gate electrode is provided above the channel via a gate insulating film.

In contrast, in a "FinFET" structure, the semiconductor layer including the source, the channel, and the drain is shaped like a fin (beam), and a gate electrode encloses the channel on its both sides via an insulating film.

The "FinFET" has a larger gate area than the planar transistor of the same size, and hence has a large driving current, which leads to devices having higher speed. To further increase the driving current, it is effective to apply stress to the channel to distort the crystal, thereby increasing the carrier mobility. In this case, it is important how to effectively apply stress to the channel.

SUMMARY OF THE INVENTION

According to an aspect of the invention, there is provided a semiconductor device including: an insulating layer; a semiconductor fin protruding from the insulating layer, extending in a first direction parallel to a major surface of the insulating layer, and having a source region, a channel section, and a drain region arranged in the first direction; a gate electrode opposed at least to a side face of the channel section in the semiconductor fin and extending in a second direction that is substantially orthogonal to the first direction and parallel to the major surface of the insulating layer; an insulating film interposed between the semiconductor fin and the gate electrode; a spacer layer provided on the channel section; a sidewall insulating layer provided adjacent to a side face of the spacer layer substantially parallel to the second direction; and a stress liner covering the sidewall insulating layer and the spacer layer and having an intrinsic stress for distorting the semiconductor fin, the sidewall insulating layer having a thickness of 45 nanometers (nm) or more in the first direction, and the spacer layer having a height of 105 nanometers (nm) or more.

According to another aspect of the invention, there is provided a semiconductor device including: an insulating layer; a semiconductor fin protruding from the insulating layer, extending in a first direction parallel to a major surface of the insulating layer, and having a source region, a channel section, and a drain region arranged in the first direction; a gate electrode opposed at least to a side face of the channel section in the semiconductor fin and extending in a second direction that is substantially orthogonal to the first direction and parallel to the major surface of the insulating layer, an end portion of the gate electrode in the second direction being located at a distance that is substantially constant from a portion in contact with the insulating layer up to a portion at a height of an upper face of the semiconductor fin; an insulating film interposed between the semiconductor fin and the gate electrode; and a stress liner covering at least a side face of the gate electrode substantially parallel to the first direction and having an intrinsic stress for distorting the semiconductor fin, the stress liner protruding no further from the side face of the gate electrode on the insulating layer in the second direction.

According to another aspect of the invention, there is provided a semiconductor device including: an insulating layer; a semiconductor fin protruding from the insulating layer, extending in a first direction parallel to a major surface of the insulating layer, and having a source region, a channel section, and a drain region arranged in the first direction; a gate electrode opposed at least to a side face of the channel section in the semiconductor fin and extending in a second direction that is substantially orthogonal to the first direction and parallel to the major surface of the insulating layer, an end portion of the gate electrode in the second direction being located at a distance that is substantially constant from a portion in contact with the insulating layer up to a portion at a height of an upper face of the semiconductor fin; an insulating film interposed between the semiconductor fin and the gate electrode; and a stress liner covering at least a side face of the gate electrode substantially parallel to the first direction and having an intrinsic stress for distorting the semiconductor fin, the stress liner protruding from the side face of the gate electrode on the insulating layer in the second direction, and a portion of the insulating layer in contact with the protruding portion of the stress liner being recessed relative to the interface between the insulating layer and the gate electrode.

DETAILED DESCRIPTION OF THE INVENTION

Embodiments of the invention will now be described with reference to the drawings.

FIRST EMBODIMENT

Figure 1:
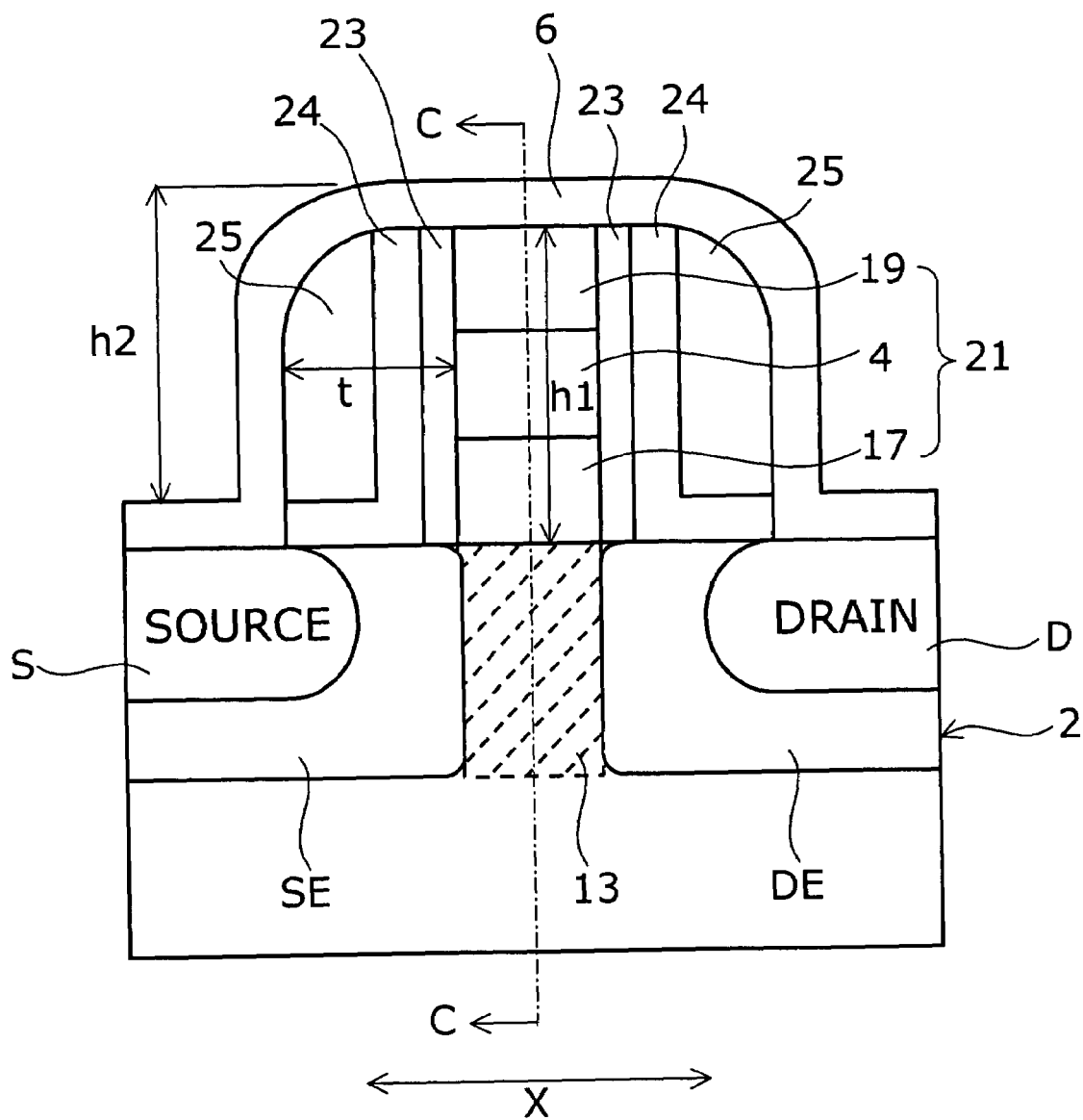
FIG. 1 is a schematic view illustrating the cross-sectional structure of the main part of a semiconductor device according to a first embodiment of the invention.

FIG. 1 is a schematic view illustrating the cross-sectional structure of the main part of a semiconductor device according to a first embodiment of the invention.

Figure 2:
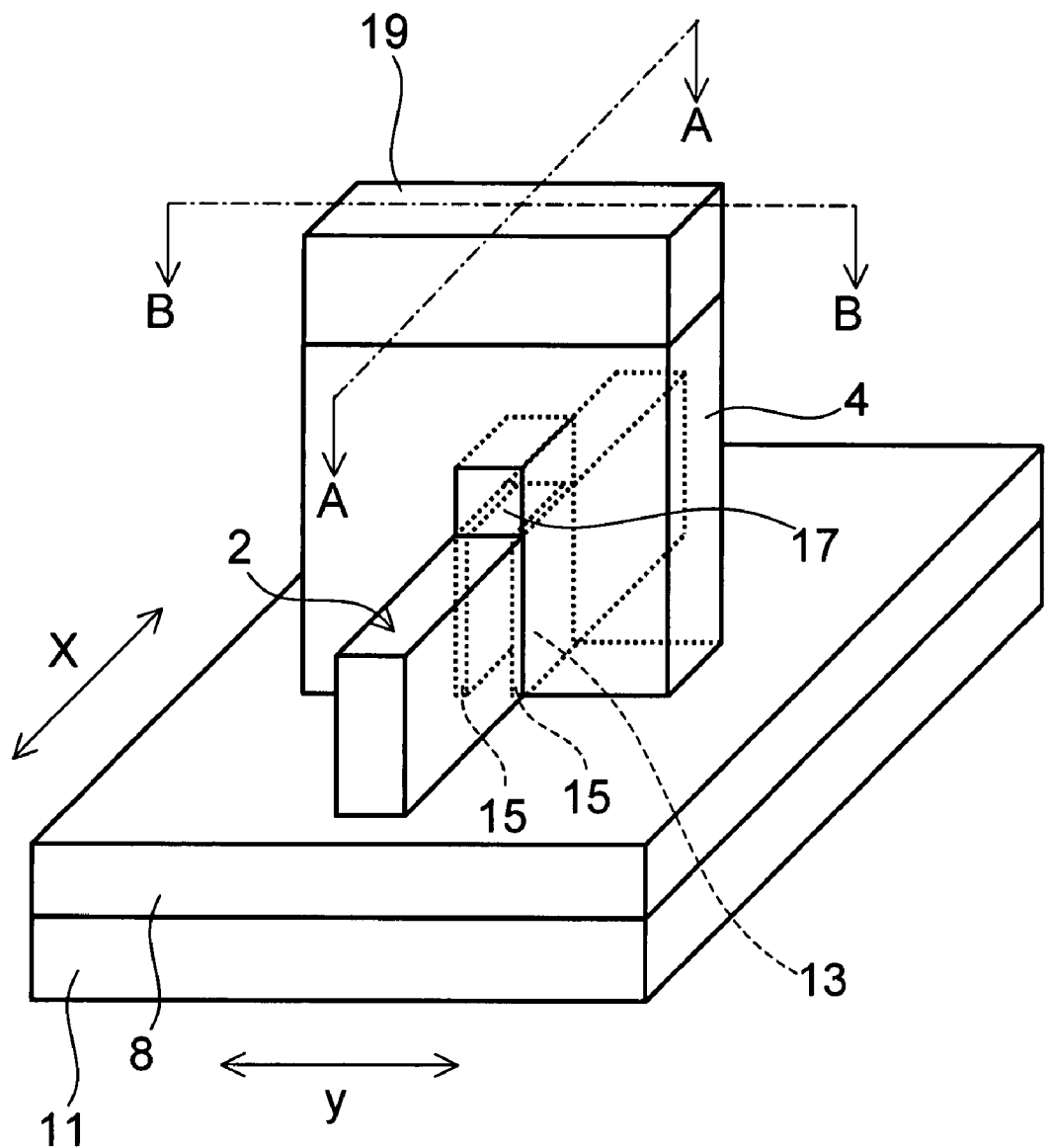
FIG. 2 is a schematic perspective view showing the positional relationship between the semiconductor fin and the gate electrode in the semiconductor device according to the first embodiment.

FIG. 2 is a schematic perspective view showing the positional relationship between the semiconductor fin 2 and the gate electrode 4 in the semiconductor device according to the first embodiment. The cross section of the semiconductor fin 2 and the gate electrode 4 in FIG. 1 corresponds to the cross section along the A-A direction in FIG. 2.

Figure 3:
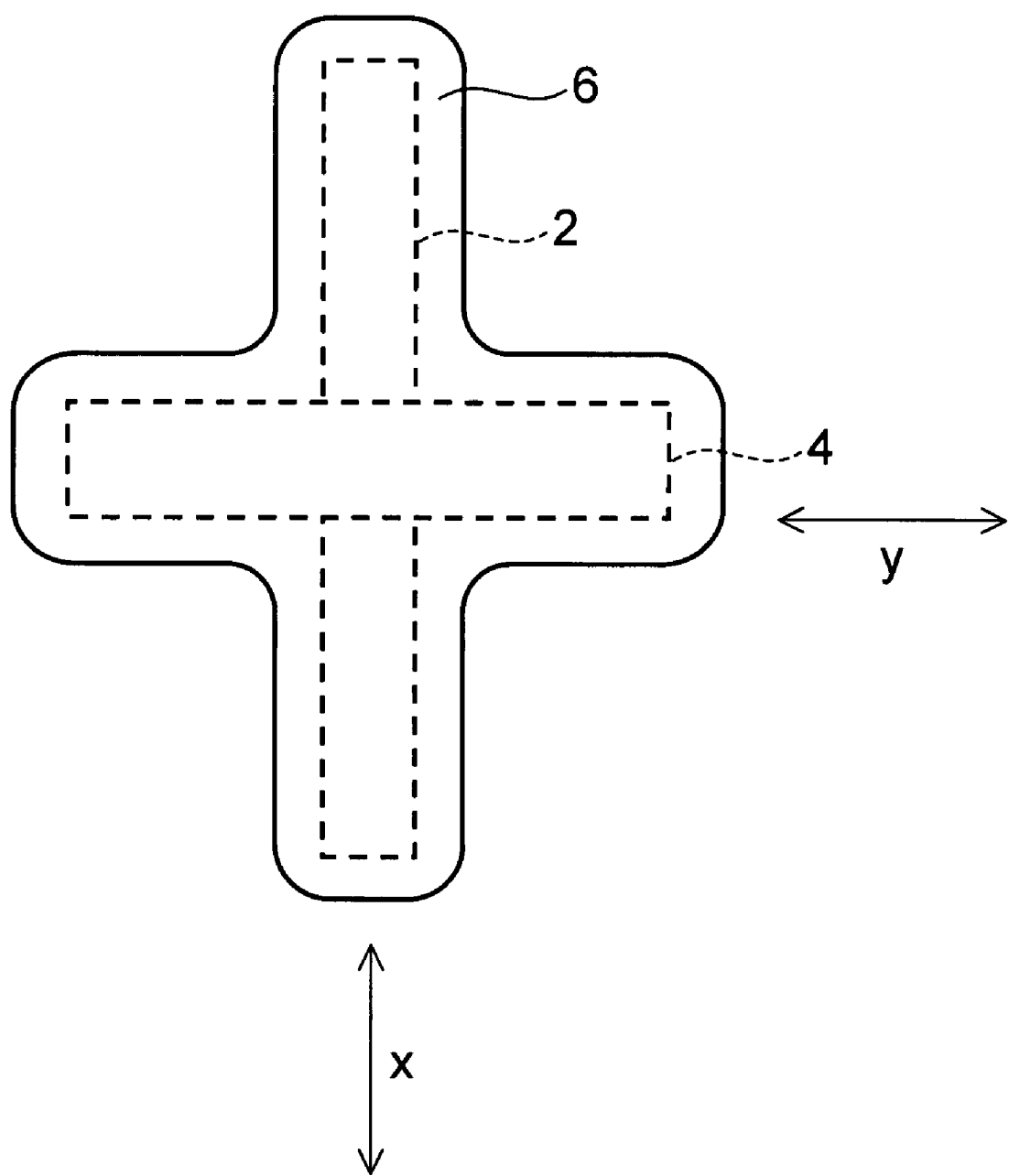
FIG. 3 is a schematic plan view showing the positional relationship among the semiconductor fin, the gate electrode, and the stress liner in the semiconductor device according to the first embodiment.

FIG. 3 is a schematic plan view showing the positional relationship among the semiconductor fin 2, the gate electrode 4, and the stress liner 6 in the semiconductor device according to the first embodiment.

As shown in FIG. 2, the semiconductor fin 2 is shaped like a fin (beam), which protrudes from an insulating layer 8 and extends in a first direction x parallel to a major surface of the insulating layer 8. The semiconductor fin 2 is provided on a semiconductor substrate 11. The insulating layer (STI: Shallow Trench Isolation) 8 is provided so as to cover the surface of the semiconductor substrate 11 and the lower portion of the semiconductor fin 2. The semiconductor fin 2 is illustratively made of silicon. The insulating layer 8 is illustratively made of silicon oxide.

In the surface portion of the semiconductor fin 2, as shown in FIG. 1, a source region S, a channel section 13, and a drain region D are formed along the first direction x. Furthermore, the source region S is surrounded by a source extension region SE, and the drain region D is surrounded by a drain extension region DE. The channel section 13 is formed between the source extension region SE and the drain extension region DE.

As shown in FIG. 2, a gate electrode 4 is provided so as to straddle the channel section 13 of the semiconductor fin 2. The gate electrode 4 is illustratively made of polysilicon (polycrystalline silicon). As shown in FIG. 3, as viewed from above, the gate electrode 4 extends in a second direction y that is substantially orthogonal to the extending direction (first direction x) of the semiconductor fin 2 and parallel to the major surface of the insulating layer 8. In the structure of the gate electrode 4, for example, a quadrangular contact may be integrally formed at the end portion of the gate electrode 4. The end portion of the gate electrode 4 may be bent in an L shape.

As shown in FIG. 2, an insulating film 15 is formed on both side faces of the semiconductor fin 2 parallel to the first direction x. The insulating film 15 is illustratively a silicon oxide film formed by thermal oxidation. Furthermore, an insulating layer 17 is provided above the channel section 13 of the semiconductor fin 2. The insulating layer 17 is illustratively made of silicon nitride. The gate electrode 4 is opposed to the side face of the channel section 13 via the insulating film 15, and to the upper face of the channel section 13 via the insulating layer 17. In the cross section of the semiconductor fin 2 shown in FIG. 1, the portion hatched with dashed lines is the portion to which the gate electrode 4 is opposed.

An insulating layer 19 illustratively made of silicon nitride is provided on the gate electrode 4. Therefore, the insulating layer 17, the gate electrode 4, and the insulating layer 19 are successively laminated on the channel section 13 and constitute a spacer layer 21 on the channel section 13 in this embodiment.

As shown in FIG. 2, both end portions of the gate electrode 4 along the second direction y in contact with the insulating layer 8 (lower end portions) do not protrude in the second direction y relative to the portion thereabove. The distance from the channel section 13 to the end portion of the gate electrode 4 in the second direction y is substantially constant from the portion in contact with the insulating layer 8 up to the portion at the height of the upper face of the semiconductor fin 2. That is, both end faces of the gate electrode 4 in the second direction y have no steps from top to bottom and form substantially perpendicular planes with respect to the surface of the insulating layer 8.

As shown in FIG. 1, first to third sidewall insulating layers (sidewalls) 23 to 25 are provided on the side face of the spacer layer 21 (insulating layer 17, gate electrode 4, and insulating layer 19) in the second direction (the direction perpendicular to the page in FIG. 1). For example, the first and second sidewall insulating layers 23, 24 are made of silicon nitride, and the third sidewall insulating layer 25 is made of TEOS (tetraethylorthosilicate).

The sidewall insulating layers 23 to 25 and the spacer layer 21 are covered with a stress liner 6. As shown in FIG. 3, the stress liner 6 covers the semiconductor fin 2 and the gate electrode 4. The stress liner 6 is illustratively made of silicon nitride, which has a stronger intrinsic stress than the silicon nitride used for the sidewall insulating layers 23 to 25. The stress liner 6 distorts the crystal of the semiconductor fin 2 (particularly the channel section 13) by its intrinsic stress (tensile or compressive stress), thereby serving to increase the carrier mobility.

Next, an example method for manufacturing a semiconductor device according to this embodiment is described.

FIGS. 4 to 17 are process cross-sectional views illustrating the main part of a process of manufacturing a semiconductor device according to this embodiment.

Figure 4:
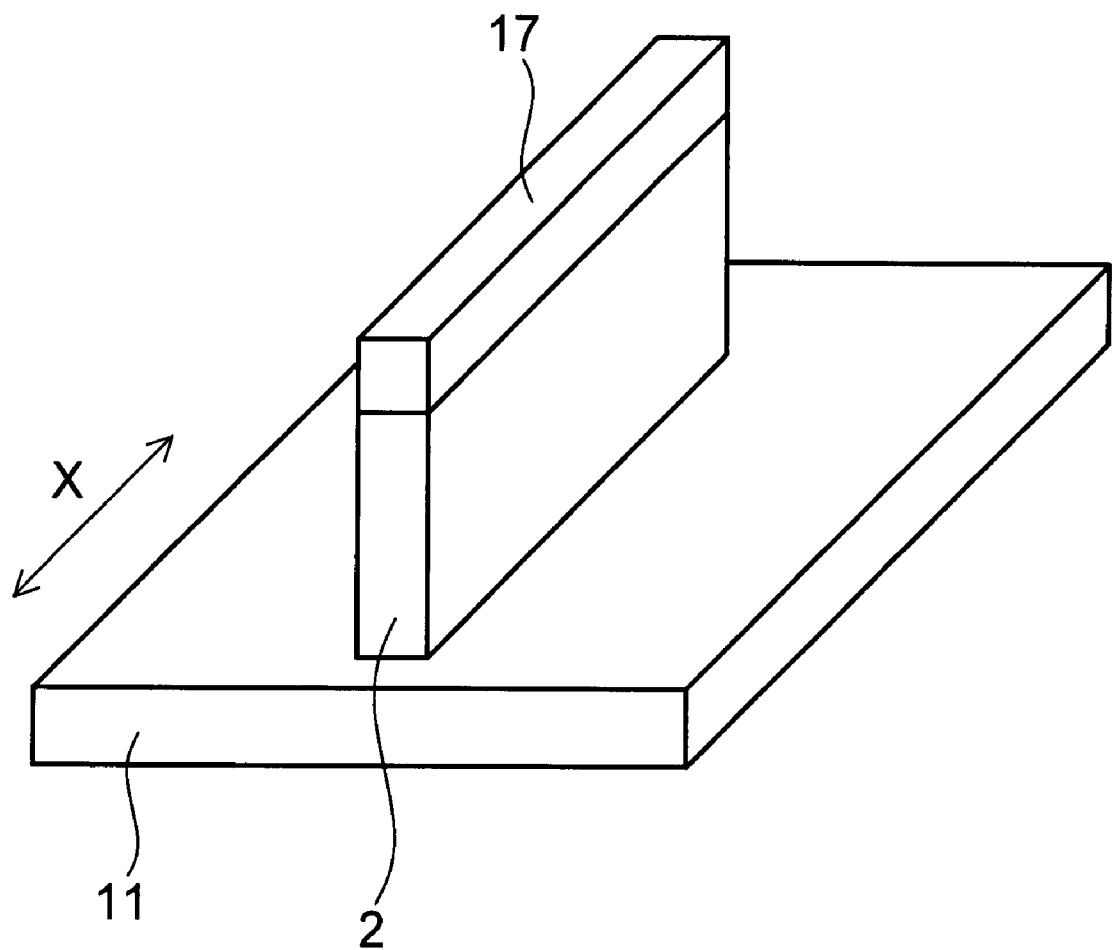
FIG. 4 is a process cross-sectional view illustrating the main part of a process of manufacturing a semiconductor device according to the first embodiment.

As shown in FIG. 4, on a semiconductor substrate 11 illustratively made of silicon, a patterned insulating layer 17 is used as a mask for etching processing, whereby a semiconductor fin 2 extending in the first direction x is formed. When the insulating layer 17 is formed, the upper face of the semiconductor fin 2 is thermally oxidized, and the insulating layer 17 is formed on the thermal oxide film.

Figure 5:
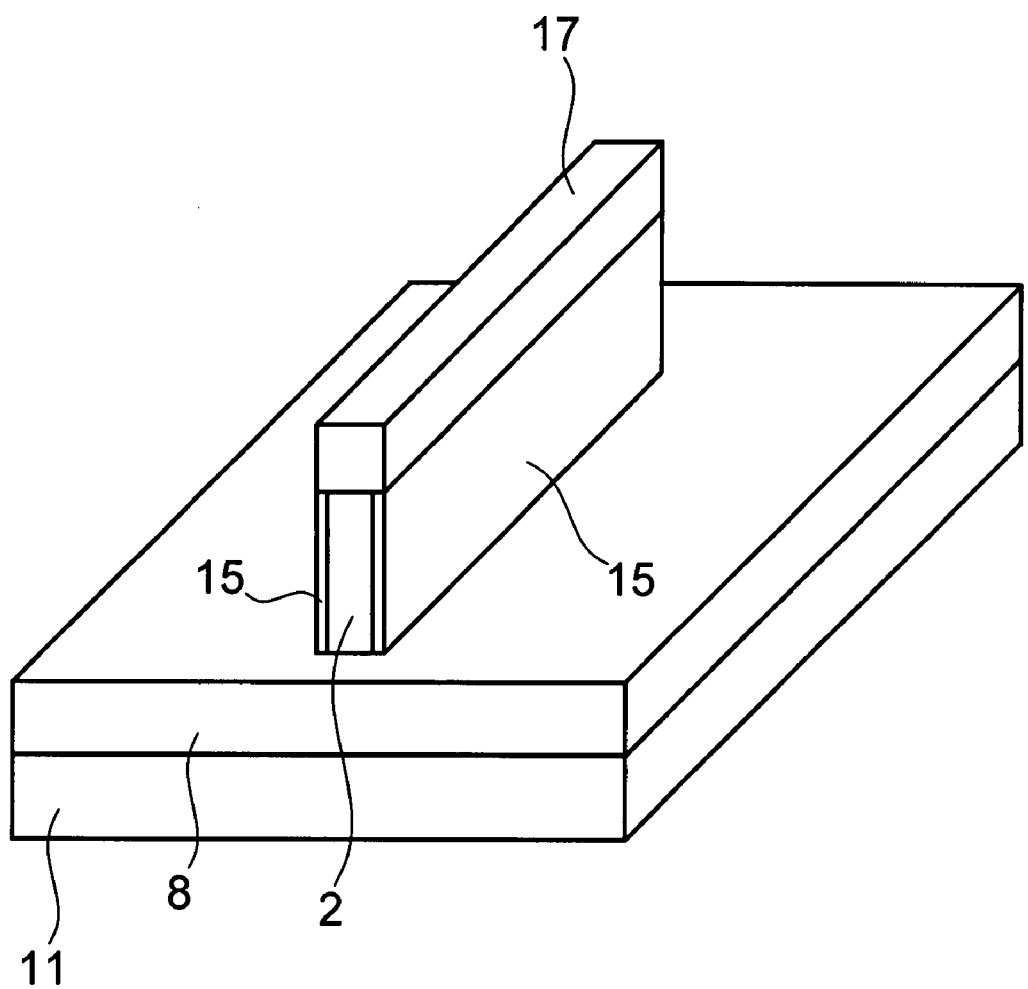
FIG. 5 is a process cross-sectional view continued from FIG. 4.

Next, as shown in FIG. 5, an insulating layer (STI: Shallow Trench Isolation) 8 is buried so as to cover the surface of the semiconductor substrate 11 and the lower portion of the semiconductor fin 2. Then the side face of the semiconductor fin 2 protruding from the insulating layer 8 is thermally oxidized to form an insulating film (silicon oxide film) 15.

Figure 6:
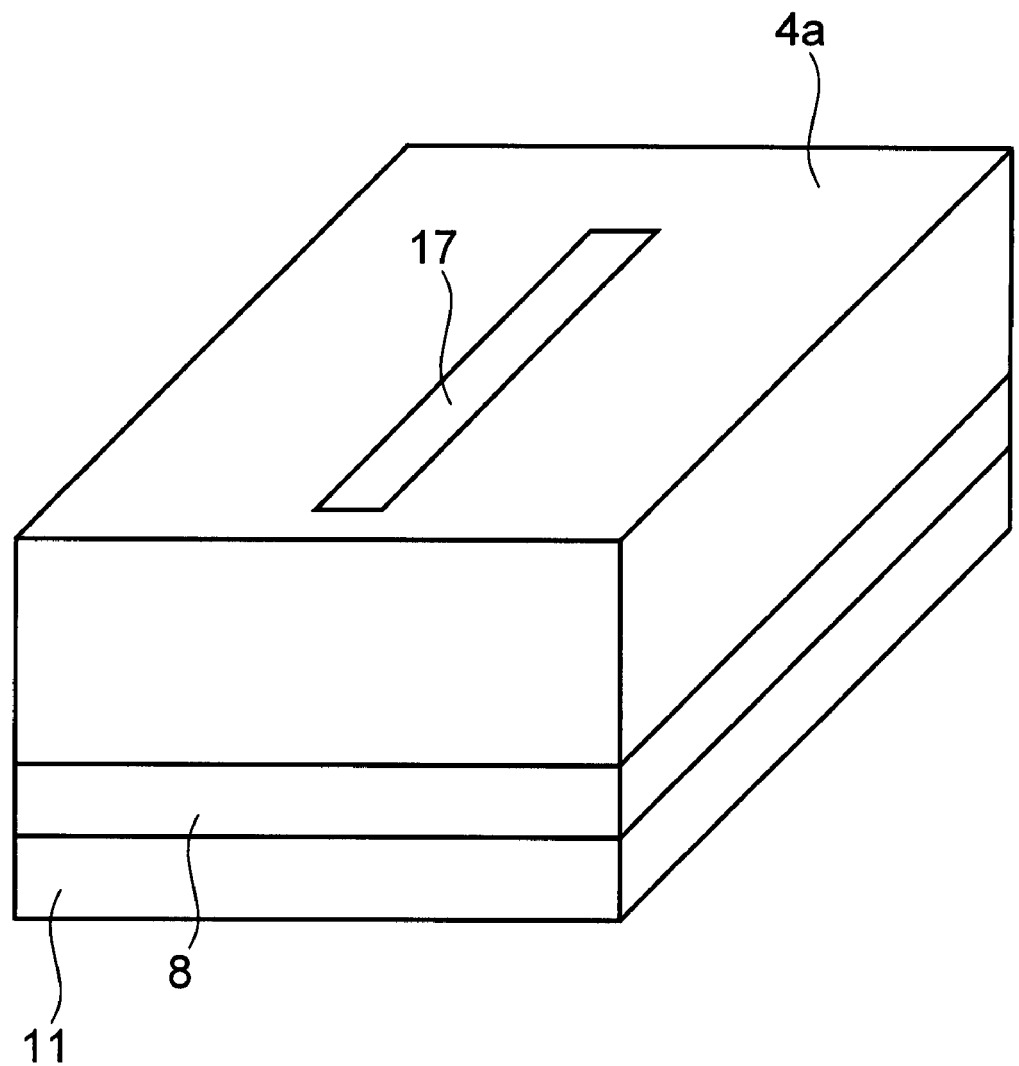
FIG. 6 is a process cross-sectional view continued from FIG. 5.

Next, a polysilicon (polycrystalline silicon) layer 4a is deposited on the insulating layer 8 so as to cover the semiconductor fin 2 and the insulating layer 17. Then, as shown in FIG. 6, the polysilicon layer 4a is polished and planarized until the upper face of the insulating layer 17 on the semiconductor fin 2 is exposed.

Figure 7:
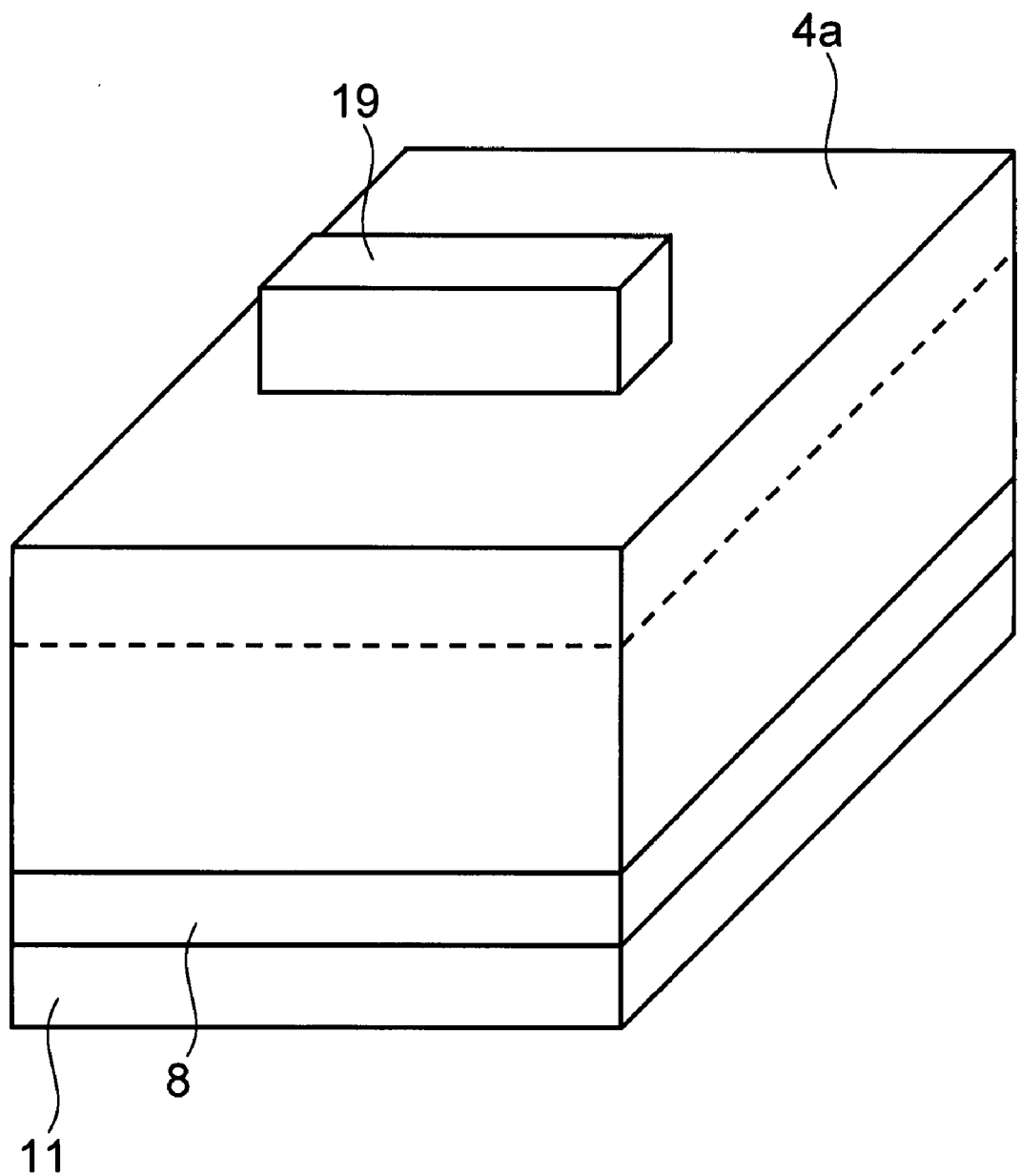
FIG. 7 is a process cross-sectional view continued from FIG. 6.

Subsequently, as shown in FIG. 7, the polysilicon layer 4a is further deposited. Then an insulating layer 19 illustratively made of silicon nitride is deposited on the polysilicon layer 4a. Subsequently, the insulating layer 19 is selectively etched and patterned by e.g. RIE (Reactive Ion Etching). This insulating layer 19 is used as a mask to conduct RIE on the polysilicon layer 4a. Thus the gate electrode 4 shown in FIG. 2 is formed.

The insulating layer 17 on the semiconductor fin 2 is left only in the portion below the gate electrode 4 (the portion above the channel section 13). The insulating film 15 formed on the side face of the semiconductor fin 2 is left only in the portion between the gate electrode 4 and the channel section 13 of the semiconductor fin 2, and the other portion is removed. Alternatively, the insulating film 15 may be left throughout the side face of the semiconductor fin 2.

Figure 8:
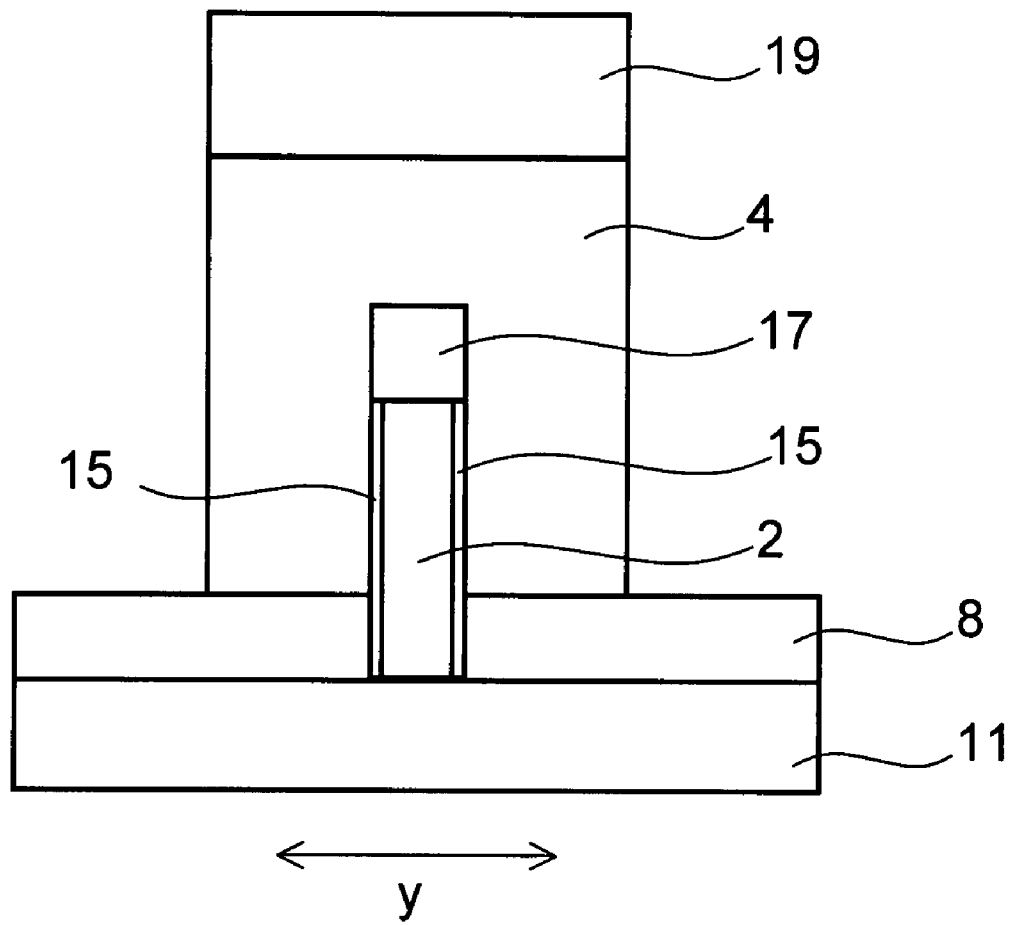
FIG. 8 is a cross-sectional view taken along B-B in FIG. 2.

FIG. 8 is a cross-sectional view taken along B-B in FIG. 2.

Figure 9:
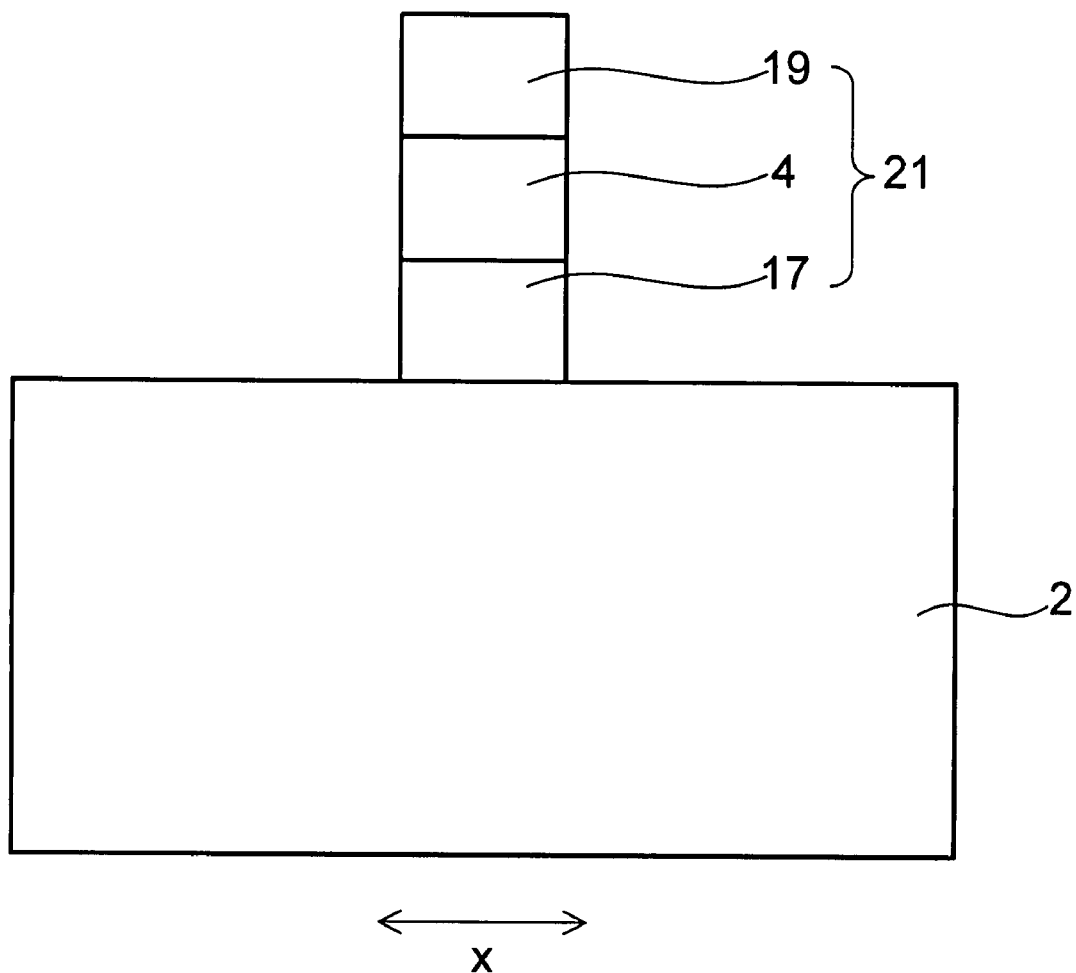
FIG. 9 is a cross-sectional view taken along A-A in FIG. 2.

FIG. 9 is a cross-sectional view taken along A-A in FIG. 2.

Figure 10:
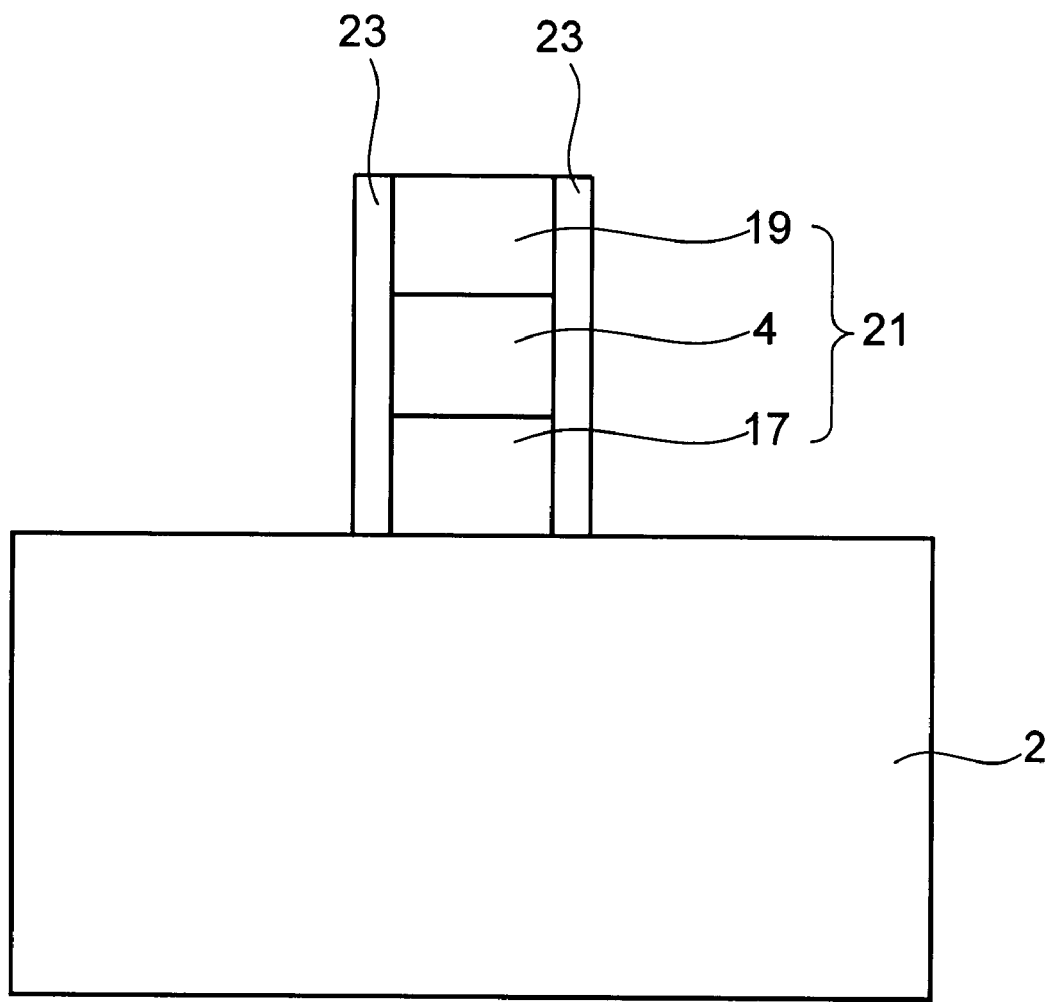
FIG. 10 is a process cross-sectional view continued from FIG. 9.

In the subsequent step, as shown in FIG. 10, a first sidewall insulating layer 23 is formed on the side face along the second direction (the direction perpendicular to the page in FIG. 10) of the spacer layer 21, which is composed of the insulating layer 17, the gate electrode 4, and the insulating layer 19. The first sidewall insulating layer 23 is illustratively made of silicon nitride.

Figure 11:
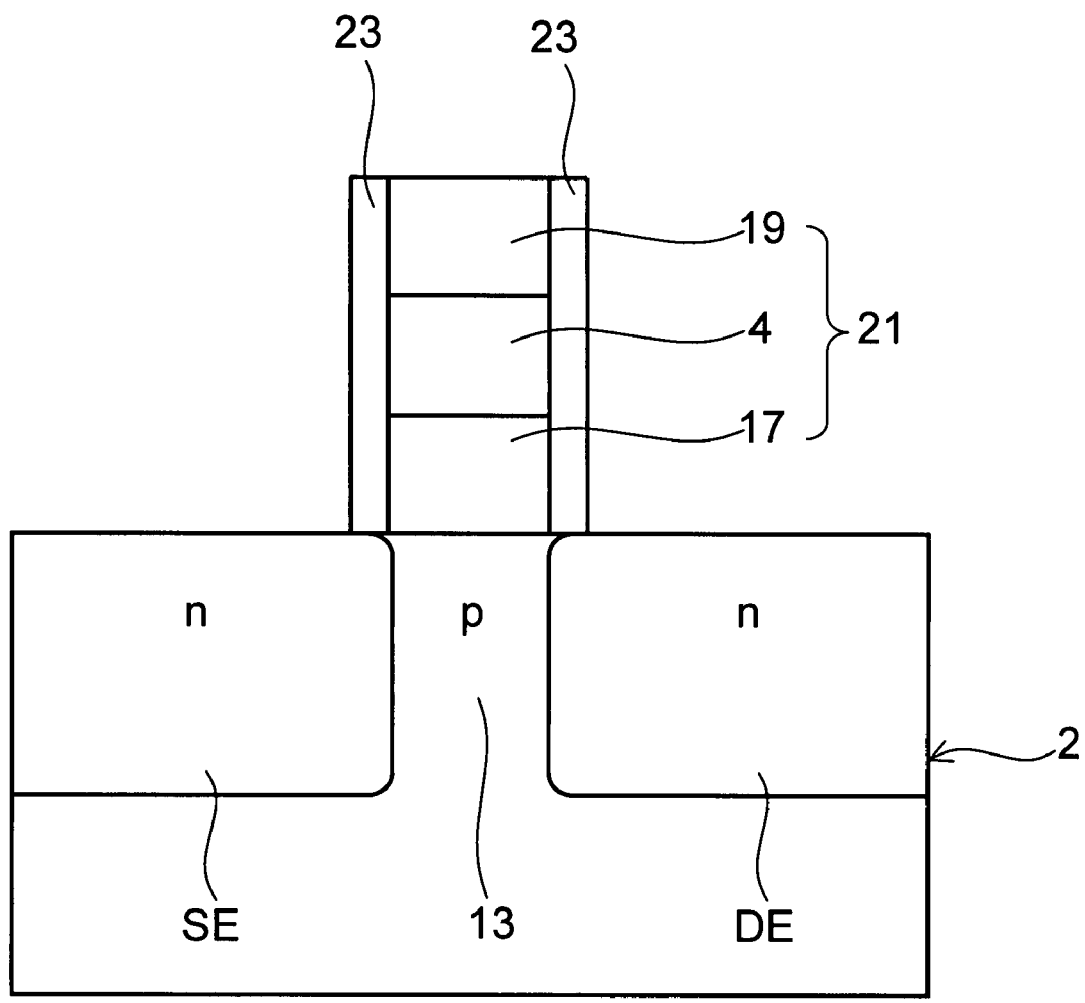
FIG. 11 is a process cross-sectional view continued from FIG. 10.

Next, oblique ion implantation is conducted using the spacer layer 21 and the first sidewall insulating layer 23 as a mask to form a source extension region SE and a drain extension region DE in the surface portion of the semiconductor fin 2 as shown in FIG. 11. The method for forming the source extension region SE and the drain extension region DE is not limited to oblique ion implantation, but it is also possible to use plasma doping, for example.

Figure 12:
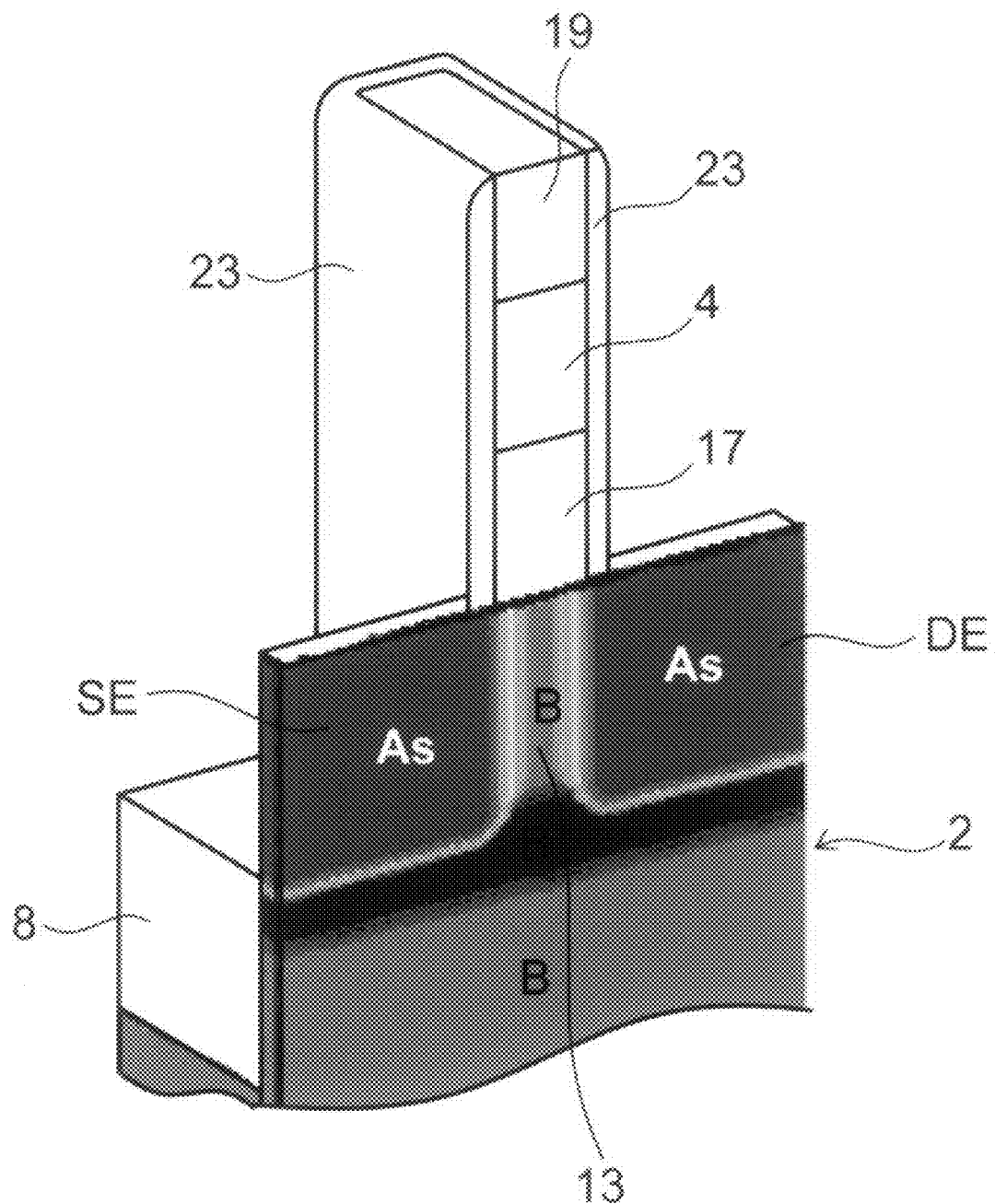
FIG. 12 is a schematic view showing the dopant distribution in the source extension region, the drain extension region, and the channel section therebetween.

FIG. 12 is a schematic view showing the dopant distribution in the source extension region SE, the drain extension region DE, and the channel section 13 therebetween.

The source extension region SE and the drain extension region DE are illustratively doped with arsenic (As) to be of a first conductivity type (n-type in this embodiment). The portion surrounding the source extension region SE and the drain extension region DE (including the channel section 13 between the source extension region SE and the drain extension region DE) is illustratively doped with boron (B) to be of a second conductivity type (p-type in this embodiment).

In the semiconductor fin 2 of FIG. 12, a darker portion has a higher concentration of arsenic (As) or boron (B).

Figure 13:
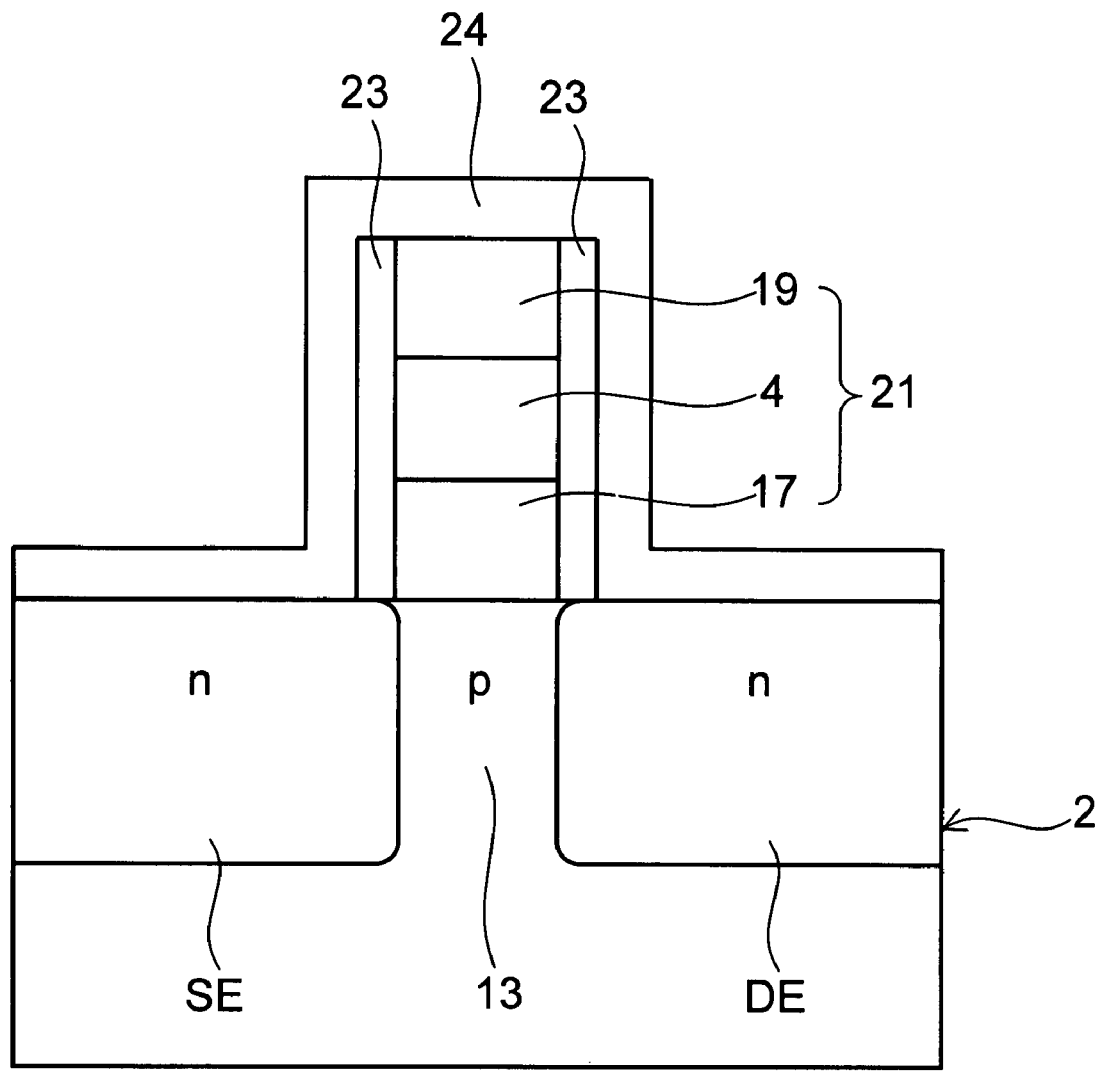
FIG. 13 is a process cross-sectional view continued from FIG. 11.
Figure 14:
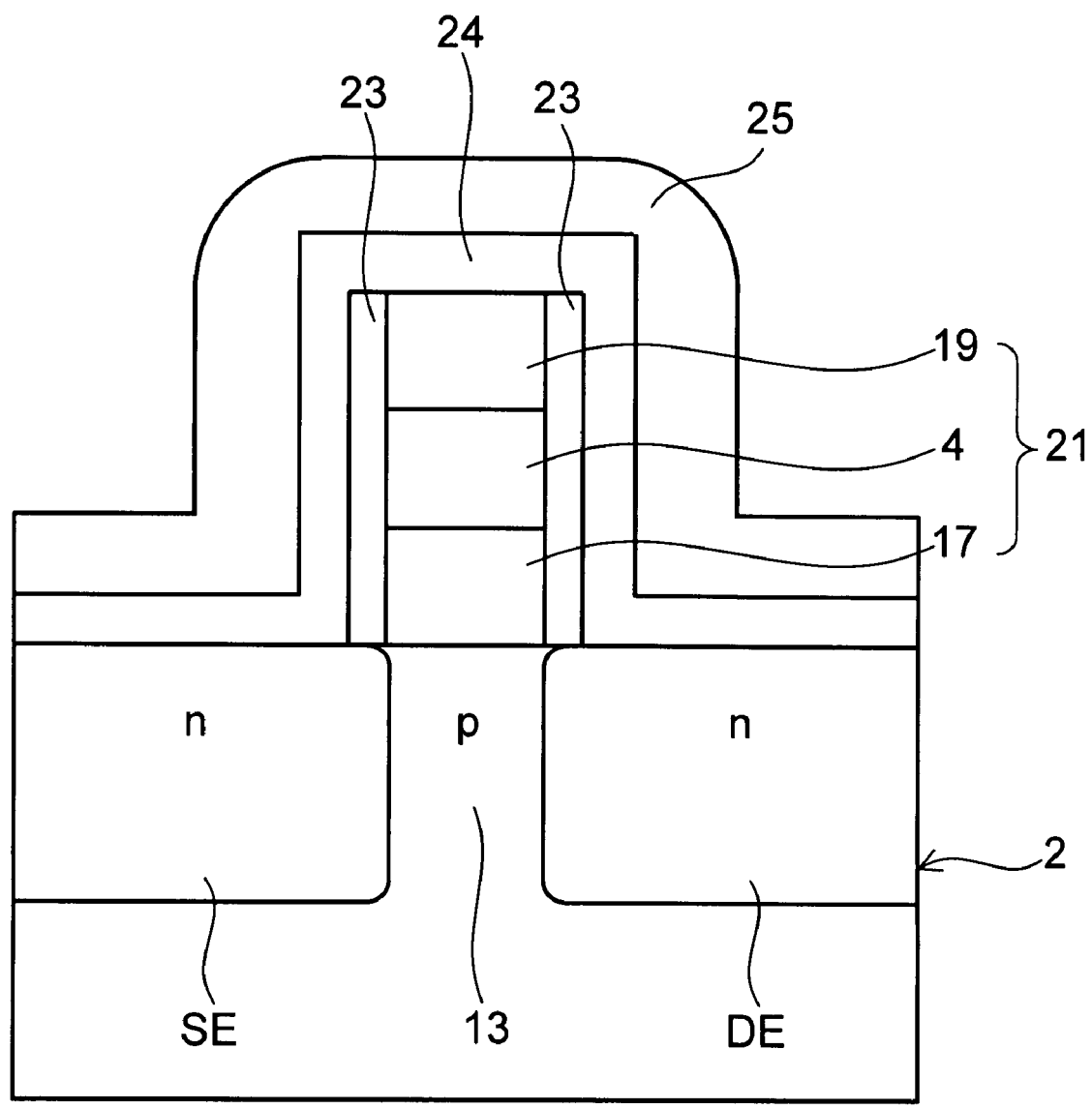
FIG. 14 is a process cross-sectional view continued from FIG. 13.

Next, as shown in FIG. 13, a second sidewall insulating layer 24 is formed so as to cover the semiconductor fin 2 and the spacer layer 21. The second sidewall insulating layer 24 is illustratively made of silicon nitride. Furthermore, as shown in FIG. 14, a third sidewall insulating layer 25 is formed to cover the second sidewall insulating layer 24. The third sidewall insulating layer 25 is illustratively made of TEOS (tetraethylorthosilicate).

Figure 15:
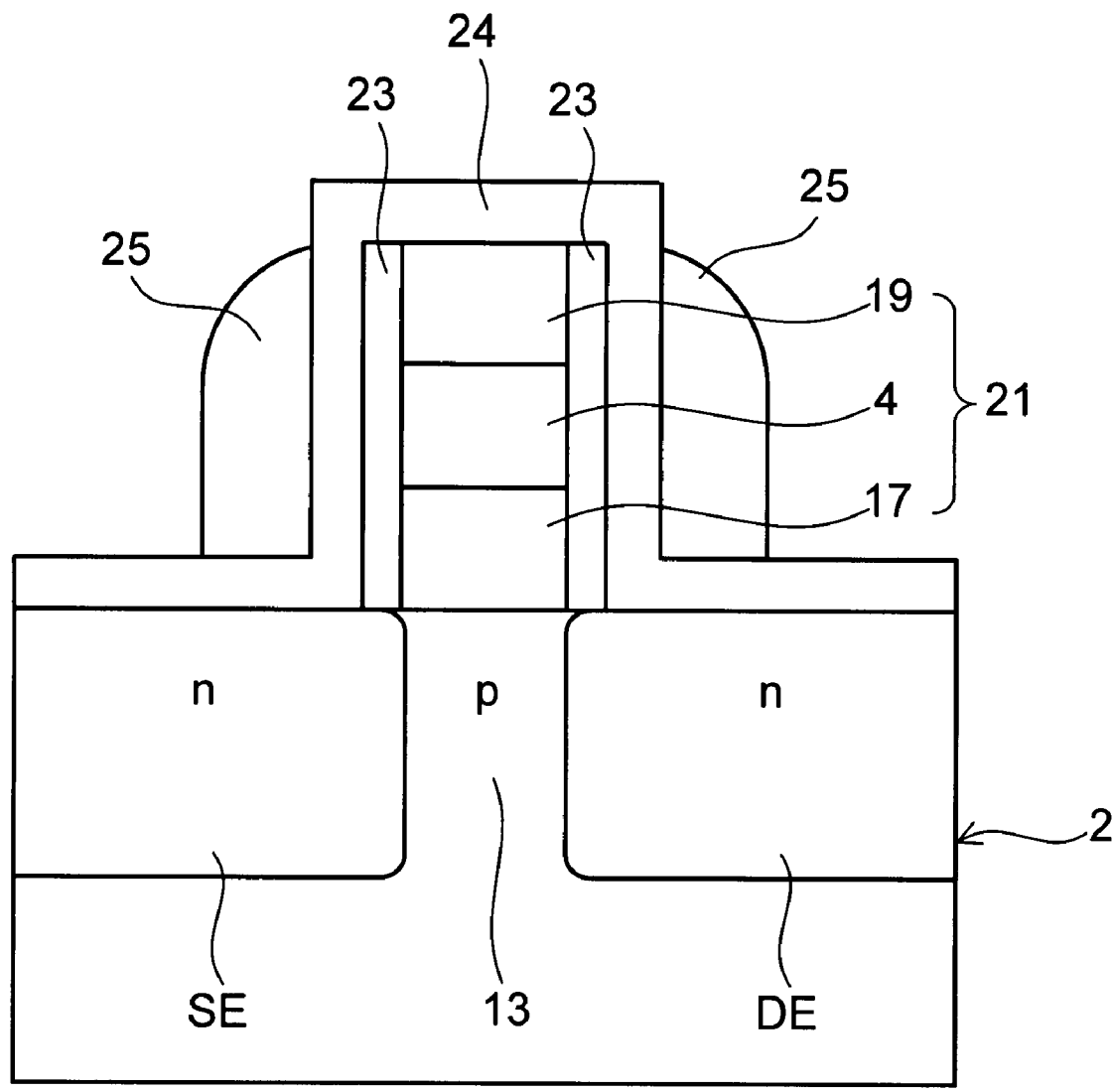
FIG. 15 is a process cross-sectional view continued from FIG. 14.
Figure 16:
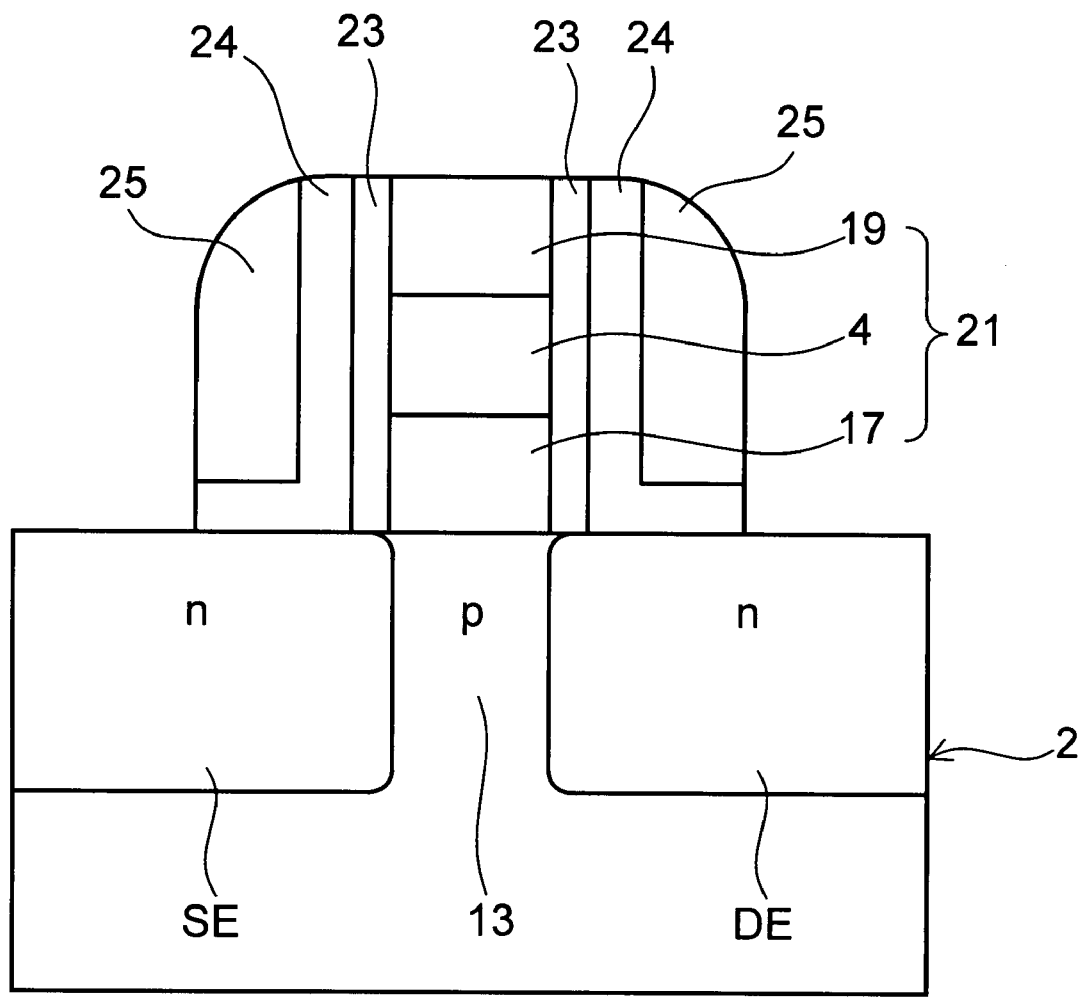
FIG. 16 is a process cross-sectional view continued from FIG. 15.

Next, RIE is conducted on the third sidewall insulating layer 25 so that the third sidewall insulating layer 25 is left only in the portion opposed to the side face of the spacer layer 21 as shown in FIG. 15. Furthermore, RIE is conducted on the second sidewall insulating layer 24 so that the second sidewall insulating layer 24 is left only in the portion adjacent to the first sidewall insulating layer 23 and the portion below the third sidewall insulating layer 25 as shown in FIG. 16.

Figure 17:
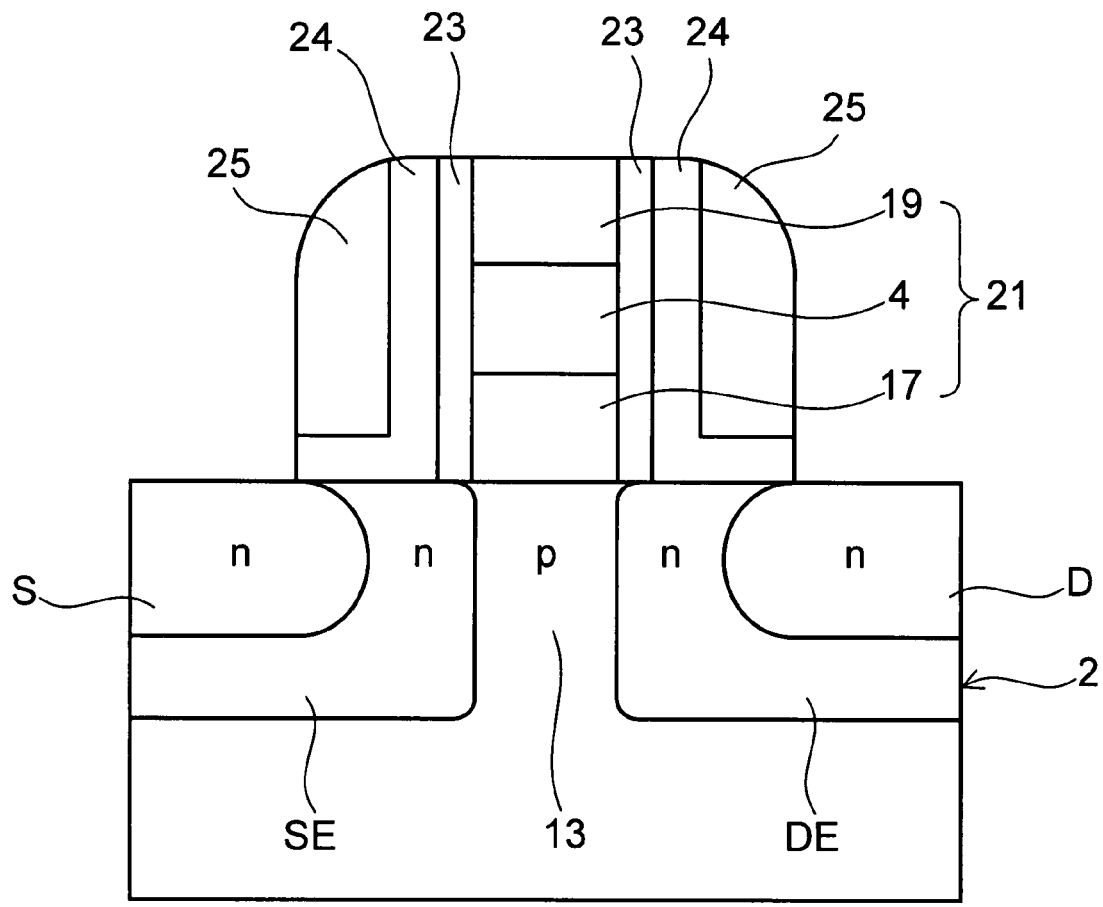
FIG. 17 is a process cross-sectional view continued from FIG. 16.

Then the spacer 21 and the first to third sidewall insulating layers 23 to 25 are used as a mask to conduct ion implantation. Thus, as shown in FIG. 17, a source region S is formed in the source extension region SE, and a drain region D is formed in the drain extension region DE. The source region S and the drain region D are illustratively formed by substantially vertical ion implantation. Alternatively, the source region S and the drain region D may be formed by oblique ion implantation or plasma doping. By diffusion, the source region S and the drain region D slightly extend into the region below the second and third sidewall insulating layers 24, 25, but are mostly located outside the first to third sidewall insulating layers 23 to 25.

Subsequently, a stress liner 6 is formed so as to cover the first to third sidewall insulating layers 23 to 25 and the spacer layer 21. Thus the structure shown in FIG. 1 is obtained. The stress liner 6 is illustratively a silicon nitride film formed by CVD (Chemical Vapor Deposition). The film thickness and the process conditions such as gas species, gas flow rate, temperature, and pressure in forming this stress liner can be controlled to determine whether the intrinsic stress is tensile or compressive and the magnitude of the stress. The stress of the stress liner 6 is varied from the intrinsic stress by heating or other processes conducted after the stress liner 6 may be formed.

Next, a description is given of the result of computing stress acting on a neighborhood of the channel section by a simulation for an n-type MOS under a heat load condition of 700° C. to 27° C. assuming that the stress liner 6 has a tensile stress of 1.3 gigapascal (GPa) as an intrinsic stress.

FIG. 18 shows stress distributions in a neighborhood of the channel section obtained by the simulation. In FIG. 18, the region surrounded by a white dotted line represents the channel section.

Figure 18C:
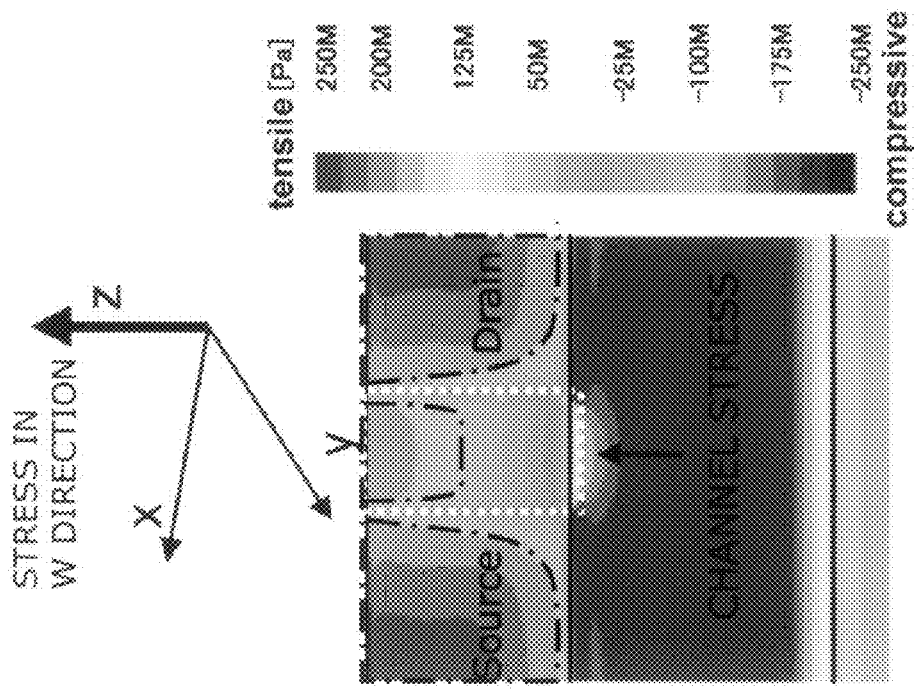
FIG. 18 shows stress distributions in a neighborhood of the channel section obtained by a simulation for an n-type MOS under a heat load condition of 700° C. to 27° C. assuming that the stress liner has a tensile stress of 1.3 gigapascal (GPa) as an intrinsic stress.
Figure 18B:
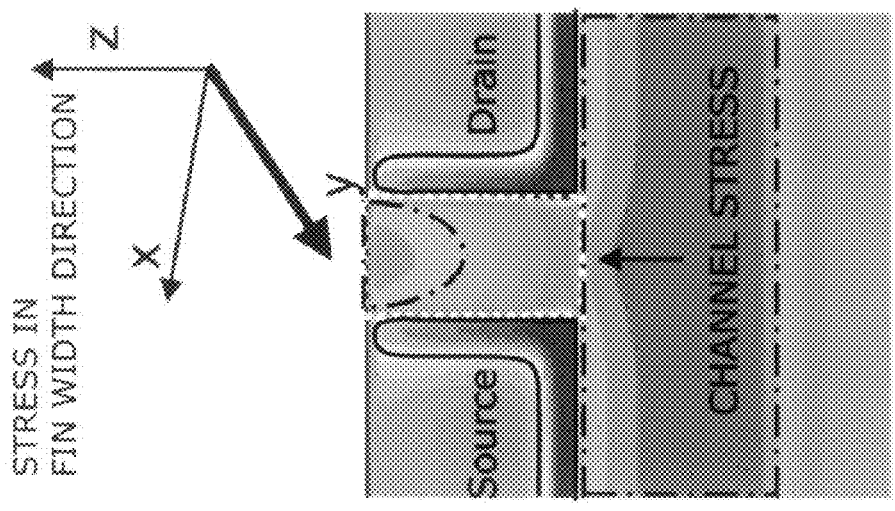
Figure 18A:
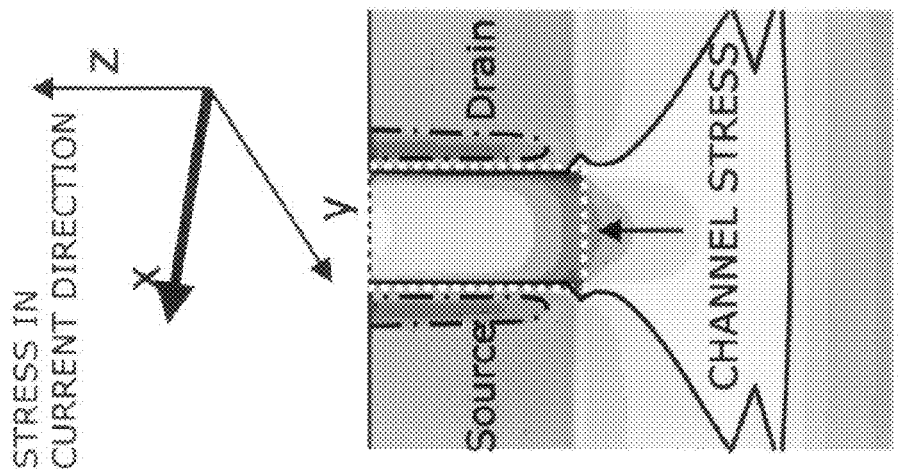

FIG. 18A shows the distribution of a stress component acting in the first direction x (the direction of the drain current).

FIG. 18B shows the distribution of a stress component acting in the second direction y (the width direction of the semiconductor fin).

FIG. 18C shows the distribution of a stress component acting in the height direction (the direction perpendicular to the wafer surface).

In the figure, the region surrounded by a solid line represents a region subjected to a tensile stress, and the region surrounded by a dot-dashed line represents a region subjected to a compressive stress. A darker portion corresponds to a higher tensile or compressive stress.

The neighborhood of the channel section is subjected to a combined stress of the three directional stress components shown in FIGS. 18A to 18C.

Figure 19:
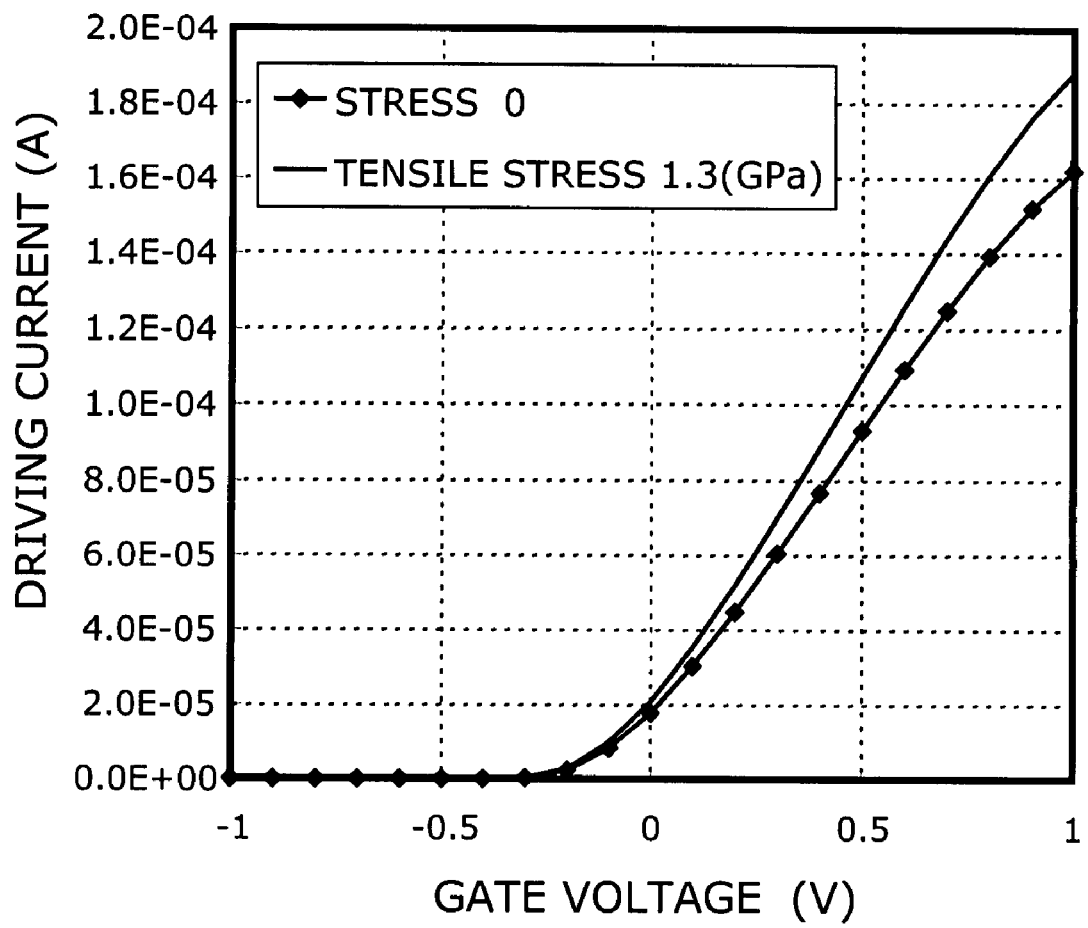
FIG. 19 shows a graph of the driving current versus gate voltage characteristics for an n-type MOS, comparing between the case where the stress acting on the channel section is zero and the case where a tensile stress of 1.3 gigapascal (GPa) acts thereon.

FIG. 19 shows a graph of the driving current versus gate voltage characteristics for an n-type MOS, comparing between the case where the stress acting on the channel section is zero and the case where the intrinsic stress of the stress liner is a tensile stress of 1.3 gigapascal (GPa). In this figure, the horizontal axis represents the gate voltage (V), and the vertical axis represents the driving current (drain current) (A).

According to the result in FIG. 19, in an n-type MOS, the driving current can be increased by using a stress liner that produces a tensile stress. However, in a p-type MOS, contrary to an n-type MOS, the driving current can be increased by using a stress liner that produces a compressive stress.

As a result of the investigation by the inventor, in an n-type MOS, the carrier mobility can be enhanced as the tensile stress acting on the channel section in the current direction becomes higher. The inventor has discovered that this can be achieved by increasing the thickness of the sidewall insulating layers 23 to 25 in the first direction (dimension t in FIG. 1).

Figure 20:
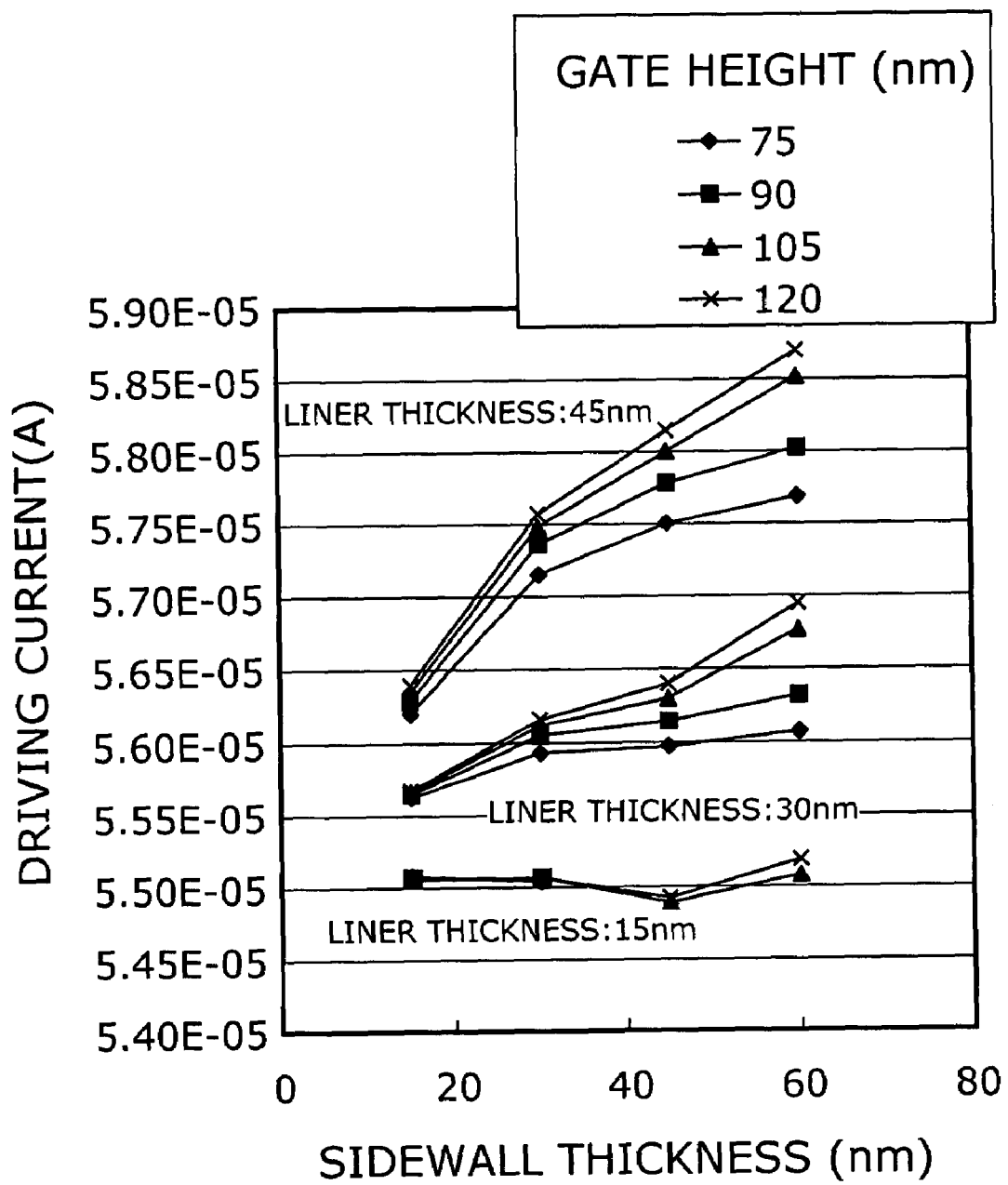
FIG. 20 is a graph illustrating the relationship between the thickness t of the sidewall insulating layers in the first direction and the driving current.

FIG. 20 is a graph illustrating the relationship between the thickness t of the sidewall insulating layers in the first direction and the driving current. The horizontal axis represents the thickness t (nm) of the sidewall insulating layers in the first direction, and the vertical axis represents the driving current (A). Numerical values in the legend represent the gate height (the height h1 of the spacer layer 21 in FIG. 1) (nm). The lower set of plots represent the case where the stress liner 6 has a thickness of 15 nm, the middle set of plots represent the case where the stress liner 6 has a thickness of 30 nm, and the upper set of plots represent the case where the stress liner 6 has a thickness of 45 nm.

On the other hand, in a p-type MOS based on a stress liner that produces a compressive stress, the carrier mobility can be enhanced as the compressive stress acting on the channel section in the current direction becomes higher. The inventor has discovered that this can also be achieved by increasing the thickness of the sidewall insulating layers in the first direction.

Furthermore, as a result of the investigation by the inventor, in an n-type MOS, the carrier mobility can be enhanced as the compressive stress acting on the channel section in the height direction becomes higher. The inventor has discovered that this can be achieved by increasing the gate height (the height h1 of the spacer layer 21 in FIG. 1).

Figure 21:
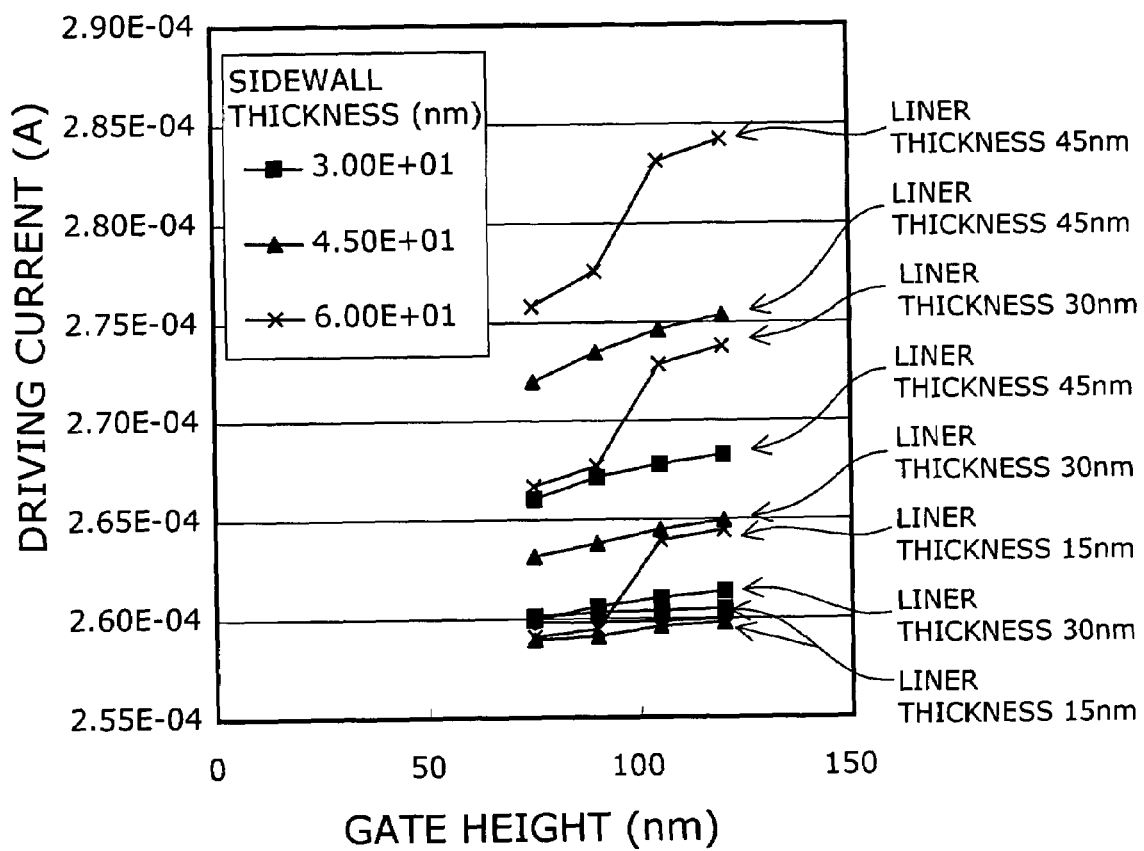
FIG. 21 is a graph illustrating the relationship between the gate height h1 and the driving current.

FIG. 21 is a graph illustrating the relationship between the gate height (the height h1 of the spacer layer 21 in FIG. 1) and the driving current. The horizontal axis represents the gate height (nm), and the vertical axis represents the driving current (A). It is difficult to measure the gate height h1. Therefore, in reality, the height h2 between the surface of the stress liner 6 on the semiconductor fin 2 and the surface of the stress liner 6 covering the spacer layer 21 was measured, and this h2 was used as a measured value of the gate height. In the graph of FIG. 21, numerical values in the legend represent the thickness t (nm) of the sidewall insulating layers in the first direction.

On the other hand, in a p-type MOS based on a stress liner that produces a compressive stress, the carrier mobility can be enhanced as the tensile stress acting on the channel section in the height direction becomes higher. The inventor has discovered that this can also be achieved by increasing the gate height (the height h1 of the spacer layer 21 in FIG. 1).

From the results in FIGS. 20 and 21, if the thickness t of the sidewall insulating layers in the first direction is set to 45 nanometers (nm) or more, and the gate height (the height of the spacer layer) h1 is set to 105 nanometers (nm) or more within the maximum dimensions limited by the required product specification and design rule, then a practically effective increase of the driving current is achieved. In particular, if the thickness t of the sidewall insulating layers in the first direction is set to 60 nanometers (nm) or more, and the height h1 of the spacer layer is set to 120 nanometers (nm) or more, then a higher driving current is obtained.

Figure 41:
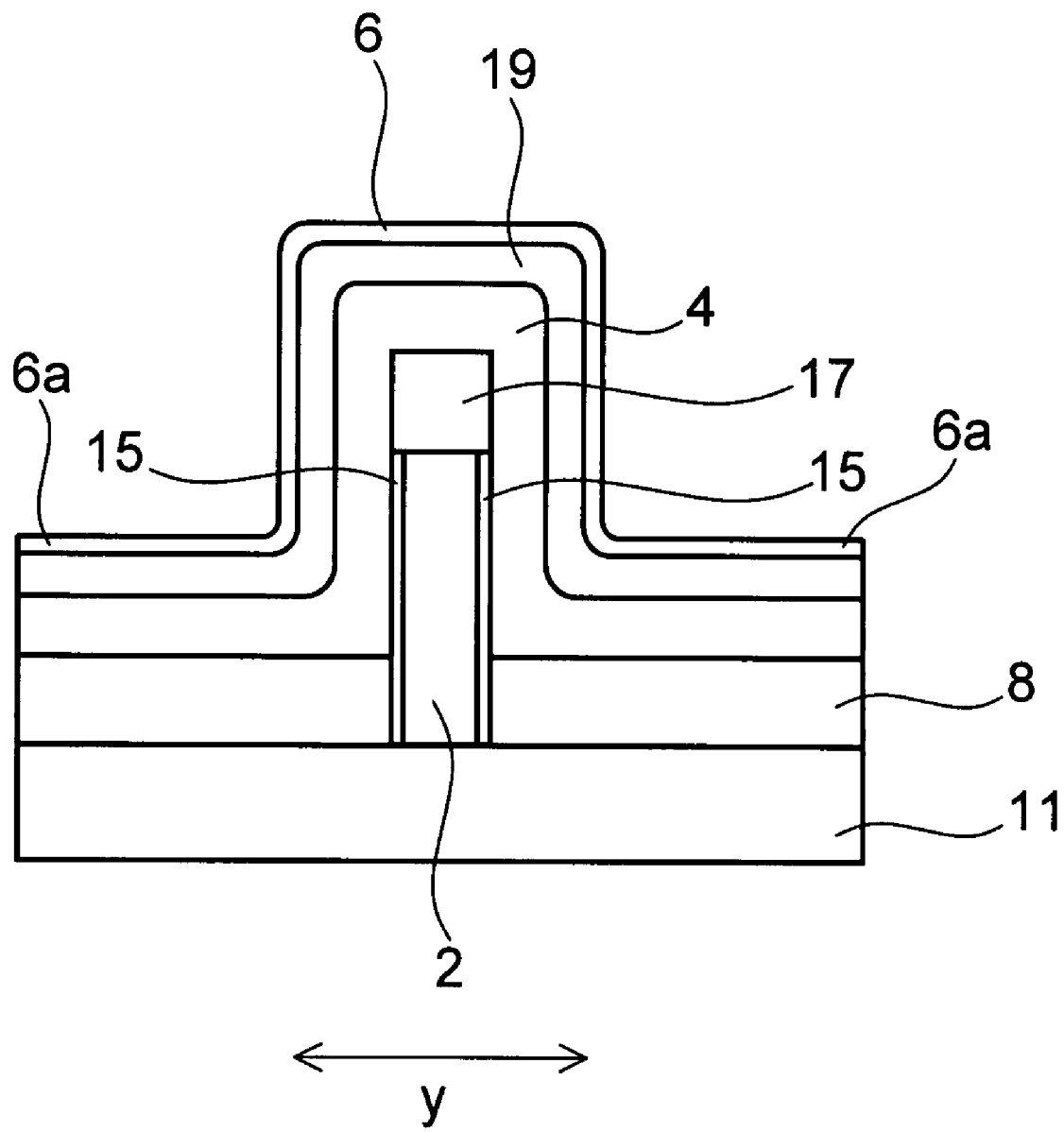
FIG. 41 is a schematic cross-sectional view of a semiconductor device according to a reference example, corresponding to the cross-sectional view of FIG. 22.

FIG. 41 is a schematic cross-sectional view of a semiconductor device according to a reference example where the channel section is cut along a plane parallel to the second direction y.

In this reference example, the lower end portion of both ends of the gate electrode 4 in the second direction y protrudes relative to the portion thereabove in the second direction y on the insulating layer 8. The stress liner 6 covers the portion of the gate electrode 4 protruding in the second direction y.

In an n-type MOS, the carrier mobility can be increased if a compressive stress acts on the channel section in the second direction y (the width direction of the semiconductor fin). However, in the structure of the reference example, the protruding portion 6a of the stress liner 6 formed on the protruding portion of the gate electrode 4 extending in the second direction y is located at an intermediate height of the channel section across the gate electrode 4 and the insulating film 15. Thus the tensile stress from the protruding portion 6a of the stress liner 6 is likely to act widely on the channel section. That is, the channel section is not likely to be subjected to a compressive stress for increasing the carrier mobility.

Figure 22:
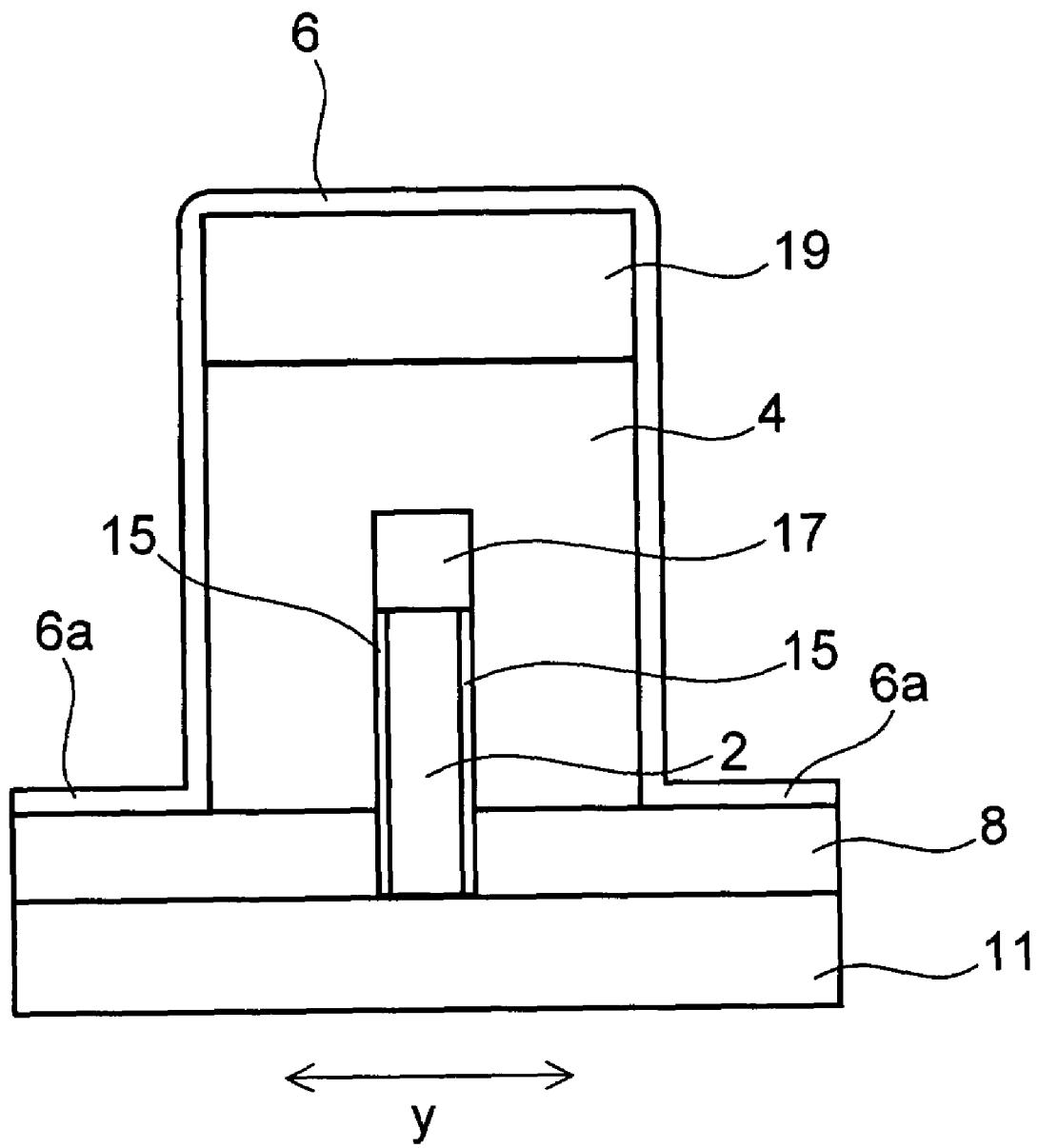
FIG. 22 is a cross-sectional view taken along C-C in FIG. 1.

On the contrary, in this embodiment, as shown in FIG. 22, which is a cross-sectional view taken along C-C in FIG. 1, both end faces of the gate electrode 4 in the second direction y are made substantially perpendicular to the major surface of the insulating layer 8. Thus the protruding portion 6a of the stress liner 6 extending in the second direction y can be positioned in the vicinity of the interface between the gate electrode 4 and the insulating layer 8. That is, the protruding portion 6a of the stress liner 6 extending in the second direction y can be positioned at the lower end of the channel section (the portion of the semiconductor fin 2 that is opposed to the gate electrode 4 across the insulating film 15). Hence the tensile stress from the protruding portion 6a of the stress liner 6 is not likely to act widely on the channel section.

In this embodiment, the first to third sidewall insulating layers 23 to 25 as shown in FIG. 1 are formed also on both end faces of the gate electrode 4 in the second direction y, and the stress liner 6 covers the end face of the gate electrode 4 via these sidewall insulating layers. Note that in FIG. 22, the sidewall insulating layers are not shown for simplicity.

However, in this case again, for a high tensile stress from the protruding portion 6a of the stress liner 6, its effect on the channel section is not negligible.

Figure 23:
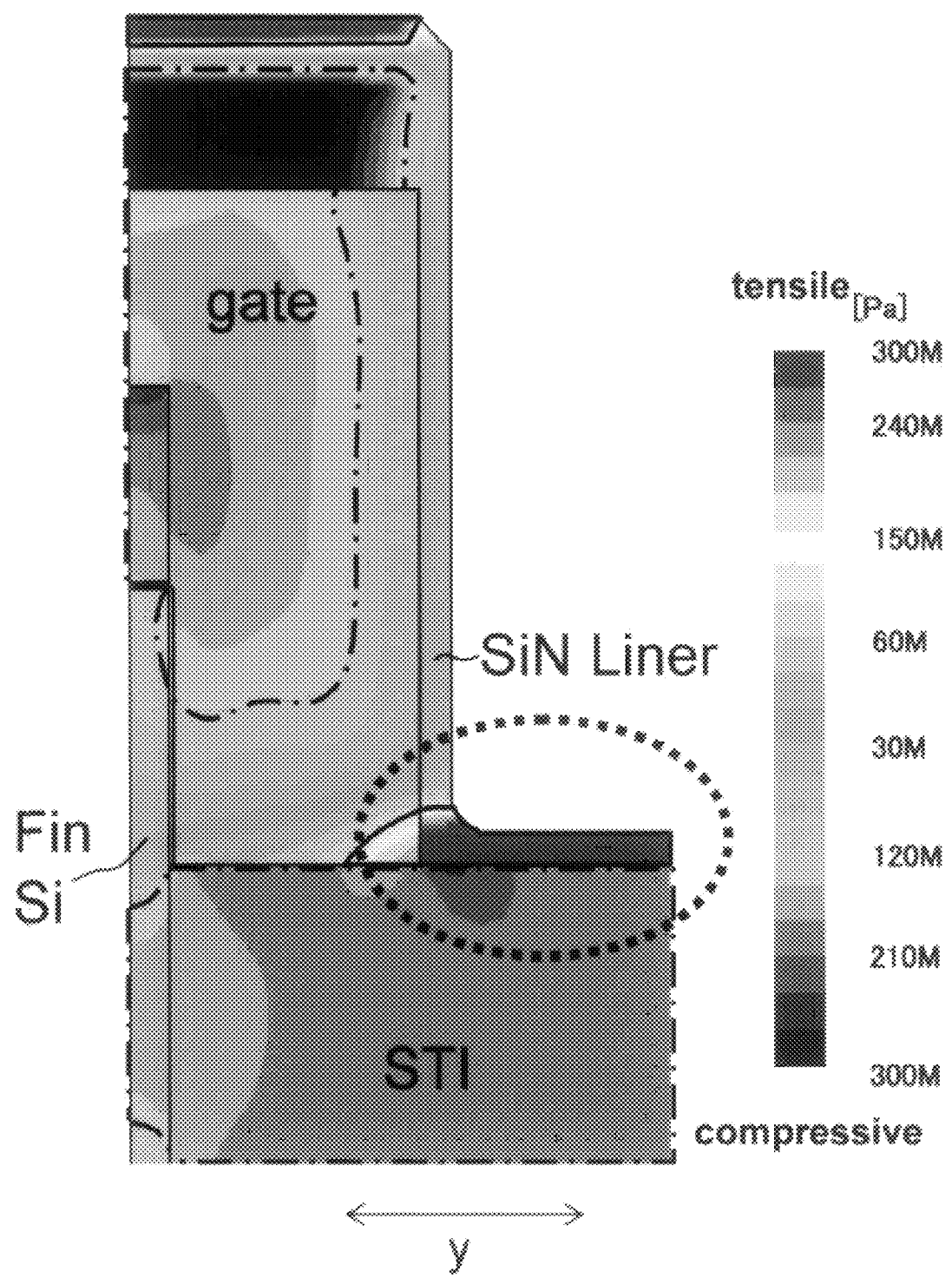
FIG. 23 shows a simulation result for stress distribution in a neighborhood of the portion of the stress liner protruding in the second direction y in an n-type MOS assuming that the stress liner has a tensile stress of 1.3 gigapascal (GPa) as an intrinsic stress.

FIG. 23 shows a simulation result for stress distribution in an n-type MOS assuming that the stress liner 6 has a tensile stress of 1.3 gigapascal (GPa) as an intrinsic stress.

In FIG. 23, the portion surrounded by a dotted line represents a neighborhood of the portion of the stress liner 6 protruding relative to the portion thereabove in the second direction y on the insulating layer (STI: Shallow Trench Isolation) 8. In the figure, the region surrounded by a solid line represents the region subjected to a tensile stress, and the region surrounded by a dot-dashed line represents the region subjected to a compressive stress. A darker portion corresponds to a higher tensile or compressive stress.

It is seen from the result in FIG. 23 that a high tensile stress of the stress liner protruding relative to the portion thereabove in the second direction y on the insulating layer (STI) 8 affects the channel section.

SECOND EMBODIMENT

Figure 24:
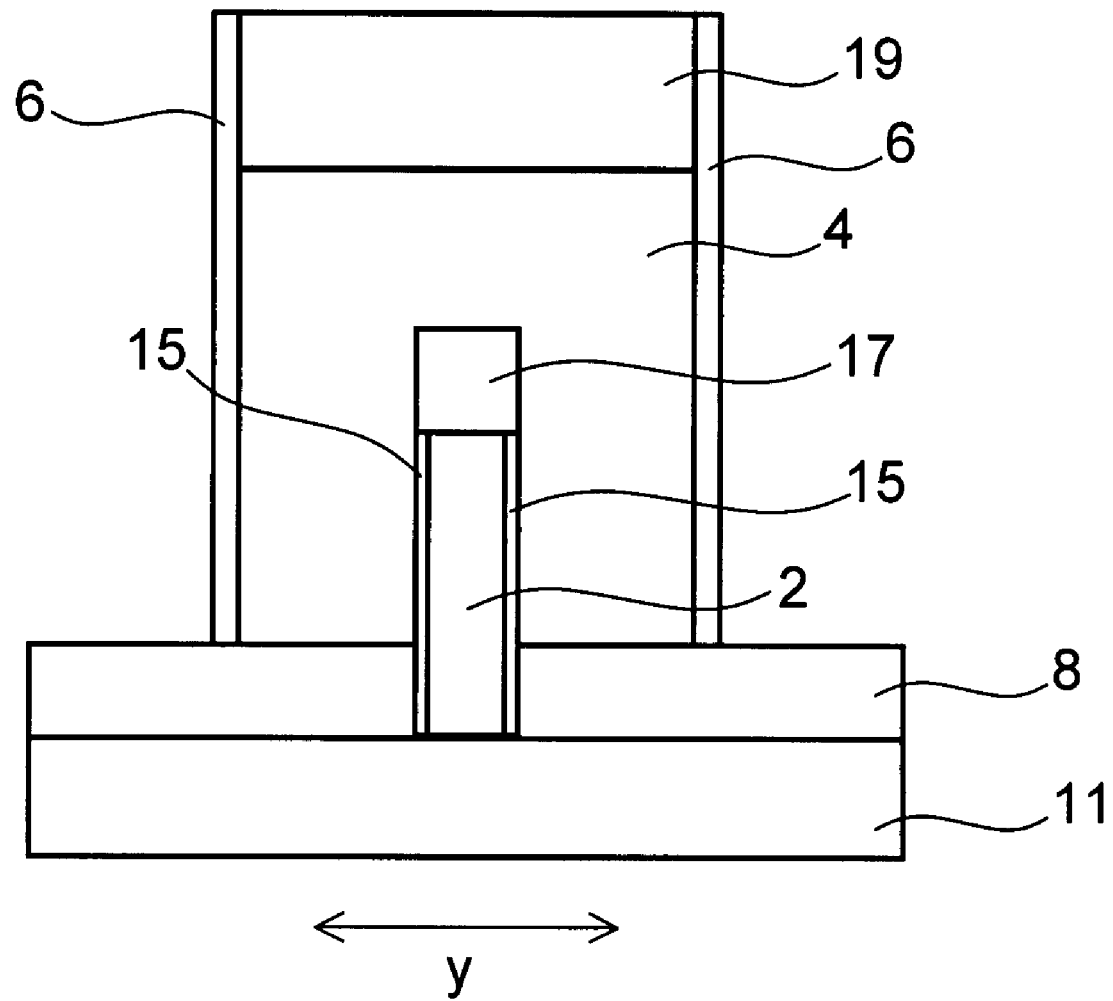
FIG. 24 is a schematic view illustrating the cross-sectional structure of a semiconductor device according to a second embodiment of the invention, the cross-sectional structure corresponding to FIG. 22.

FIG. 24 is a schematic view illustrating the cross-sectional structure of a semiconductor device according to a second embodiment of the invention, the cross-sectional structure corresponding to FIG. 22.

In the following embodiments, the same components as those in the first embodiment described above are marked with the same reference numerals and not described in detail.

In this embodiment, the protruding portion 6a of the stress liner 6 extending in the second direction y (the width direction of the semiconductor fin) in FIG. 22 is removed by e.g. RIE. The distance from the channel section to the end portion of the stress liner 6 in the second direction y is substantially constant from the portion in contact with the insulating layer (STI) 8 up to the portion at the height of the upper face of the semiconductor fin 2. That is, both end faces of the stress liner 6 in the second direction y have no steps from top to bottom and form substantially perpendicular planes with respect to the surface of the insulating layer 8. The stress liner 6 on the insulating layer 19 is also removed by RIE, and the stress liner 6 is left on both end faces of the gate electrode 4 in the second direction y (side faces parallel to the first direction x). Here, the sidewall insulating layers on both end faces of the gate electrode 4 in the second direction y, which are not shown in FIG. 22, may or may not be formed.

By omitting the protruding portion 6a of the stress liner 6 extending in the second direction y (the width direction of the semiconductor fin), it is possible to prevent the tensile stress of the stress liner 6 from acting on the channel section in the second direction y. As a result, the carrier mobility in the channel section can be enhanced, and the driving current can be increased.

FIG. 25 shows stress distribution diagrams for simulated stress in the second direction y in the channel section, where the stress before RIE on the protruding portion 6a of the stress liner 6 extending in the second direction y is compared with the stress after RIE. In an n-type MOS, it is assumed that the stress liner 6 has a tensile stress of 1.3 gigapascal (GPa) as an intrinsic stress. In the figure, the region surrounded by a white dotted line represents the channel section, the region surrounded by a solid line represents the region subjected to a tensile stress, and the region surrounded by a dot-dashed line represents the region subjected to a compressive stress. A darker portion corresponds to a higher tensile or compressive stress.

Figure 25A:
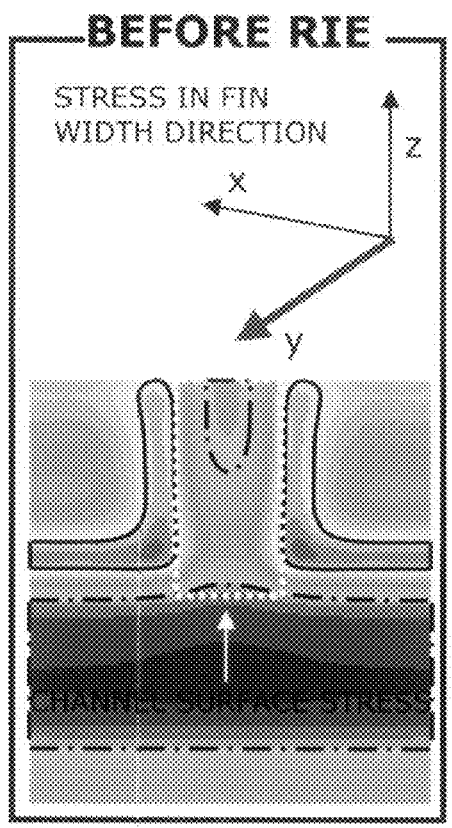
FIG. 25 shows stress distribution diagrams for simulated stress in the second direction y in the channel section, where the stress before RIE on the protruding portion of the stress liner extending in the second direction y is compared with the stress after RIE.
Figure 25B:
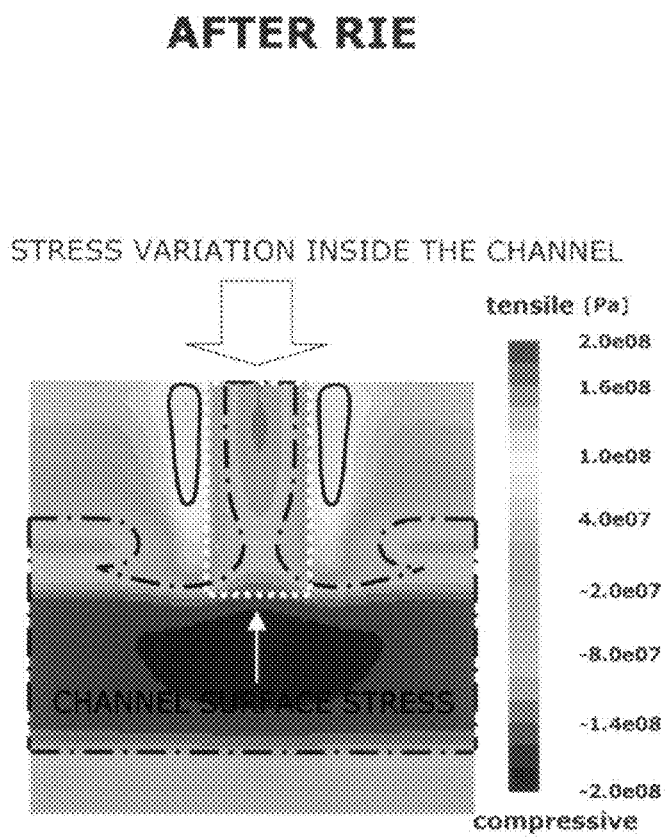

FIG. 25A shows a stress distribution in the second direction y before RIE on the protruding portion 6a, that is, in the structure of FIG. 22. FIG. 25B shows a stress distribution in the second direction y after RIE on the protruding portion 6a, that is, in the structure of FIG. 24.

From this result in FIG. 25, by omitting the protruding portion 6a of the stress liner 6 extending in the second direction y, a compressive stress can be effectively applied to the channel section in the second direction y (the width direction of the semiconductor fin), and the carrier mobility can be enhanced.

Figure 26:
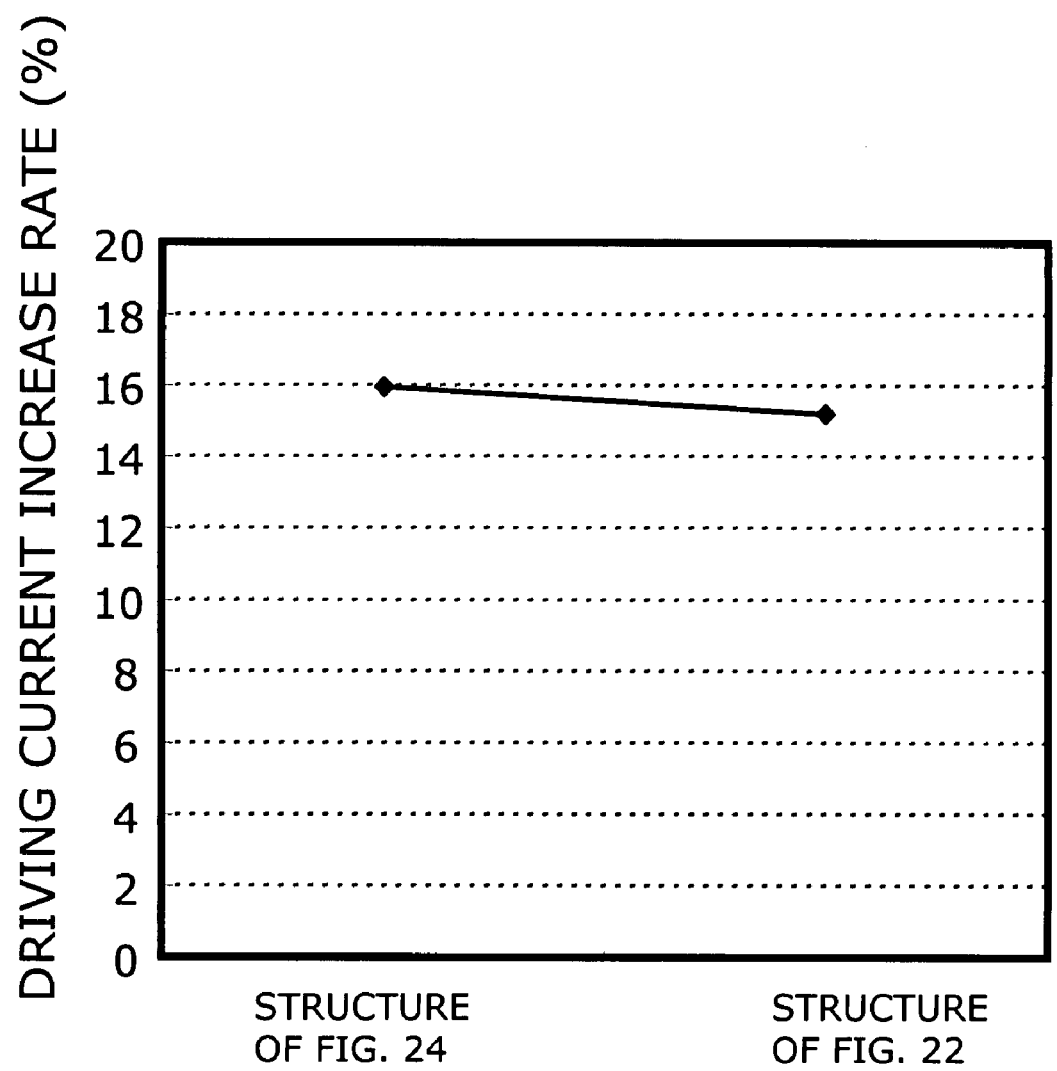
FIG. 26 is a graph comparing the driving current increase rates between the structure of FIG. 24 and the structure of FIG. 22.

FIG. 26 is a graph comparing the driving current increase rates between the structure of FIG. 24 and the structure of FIG. 22. The driving current increase rate indicated along the vertical axis represents the increase rate (%) of the driving current relative to the case where no stress liner 6 is used, that is, the case of zero stress.

From this result in FIG. 26, the structure without the protruding portion 6a of the stress liner 6 extending in the second direction y has a higher driving current increase rate.

On the other hand, in a p-type MOS, the carrier mobility is enhanced when the stress in the second direction y (the width direction of the semiconductor fin) is rather a tensile stress. Therefore, in a p-type MOS, it is preferable to prevent the compressive stress of the protruding portion 6a of the stress liner having a compressive stress as an intrinsic stress from acting on the channel section. Thus, also in a p-type MOS, by omitting the protruding portion 6a of the stress liner 6 extending in the second direction y, a tensile stress can be effectively applied to the channel section in the second direction y (the width direction of the semiconductor fin). Thus the carrier mobility can be enhanced, and the driving current can be increased.

THIRD EMBODIMENT

Figure 27:
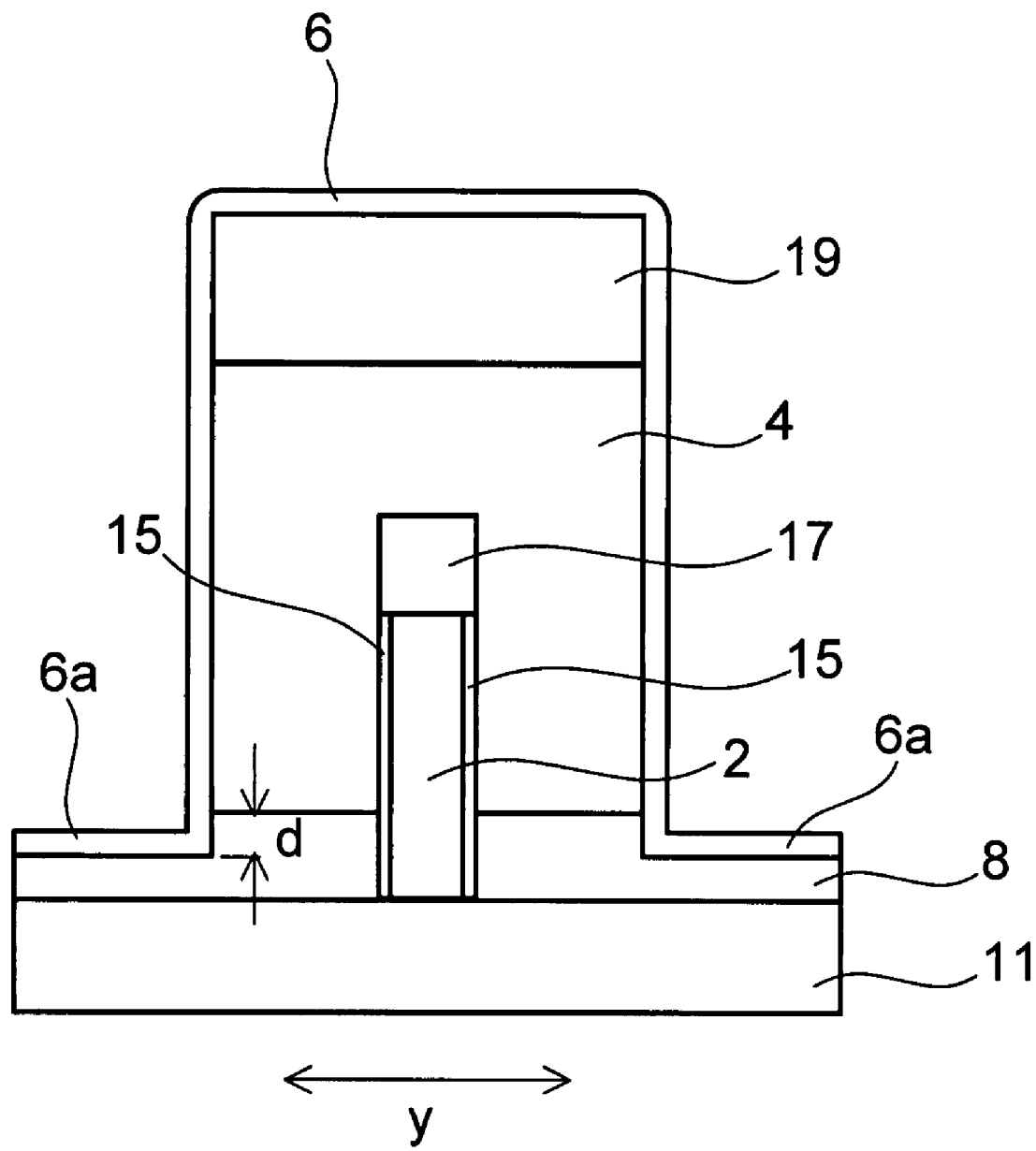
FIG. 27 is a schematic view illustrating the cross-sectional structure of a semiconductor device according to a third embodiment of the invention, the cross-sectional structure corresponding to FIG. 22, where the depth (etching depth) d of the recessed portion of the insulating layer is larger than the thickness of the stress liner.
Figure 28:
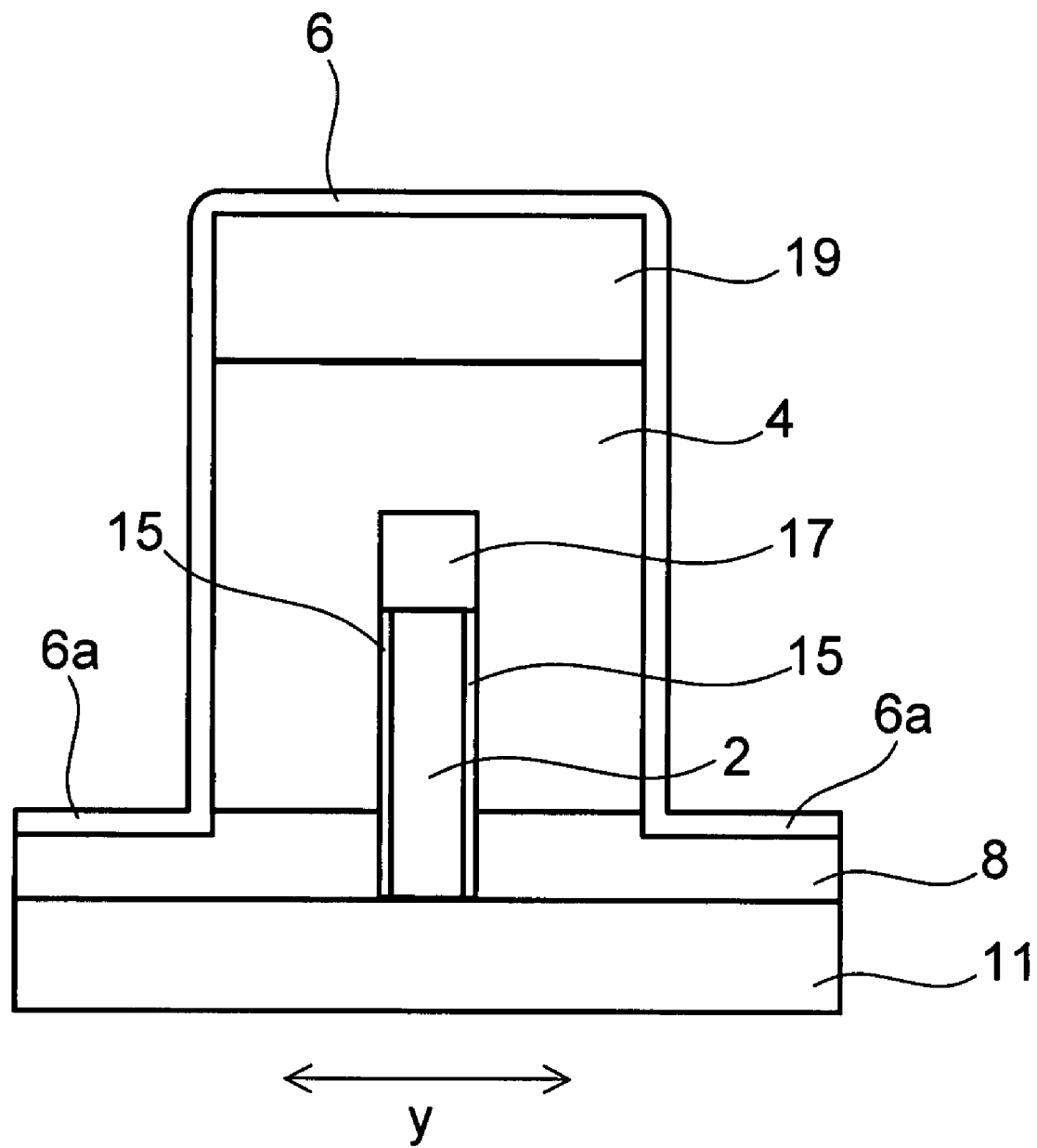
FIG. 28 is a schematic view illustrating the cross-sectional structure of a semiconductor device according to the third embodiment of the invention, the cross-sectional structure corresponding to FIG. 22, where the depth (etching depth) d of the recessed portion of the insulating layer is substantially equal to the thickness of the stress liner.

FIGS. 27 and 28 are schematic views illustrating the cross-sectional structure of a semiconductor device according to a third embodiment of the invention, the cross-sectional structure corresponding to FIG. 22.

In this embodiment, like the structure in FIG. 22, the stress liner 6 covers both end faces of the gate electrode 4 in the second direction y and the upper face of the insulating layer 19. Furthermore, both end faces of the stress liner 6 in the second direction y protrude in the second direction y and cover the insulating layer 8 from above. However, the portion of the insulating layer 8 in contact with the protruding portion 6a of the stress liner 6 is recessed relative to the interface between the insulating layer 8 and the gate electrode 4. The recess of the insulating layer 8 is formed by etching (e.g. RIE) before forming the stress liner 6. More specifically, in this embodiment, the protruding portion 6a of the stress liner 6 extending in the second direction y is located lower than the channel section (the portion opposed to the gate electrode 4 via the insulating film 15 in the semiconductor fin 2). Here again, the sidewall insulating layers on both end faces of the gate electrode 4 in the second direction y, which are not shown in FIG. 22, may or may not be formed.

FIG. 27 shows the case where the depth (etching depth) d of the recessed portion of the insulating layer 8 is larger than the thickness of the stress liner 6.

FIG. 28 shows the case where the depth (etching depth) d of the recessed portion of the insulating layer 8 is substantially equal to the thickness of the stress liner 6.

FIG. 29 shows a simulation result for stress distribution in the second direction y in the channel section for different values of etching depth d of the insulating layer 8 where the stress liner 6 has a thickness of 20 nanometers (nm). In an n-type MOS, it is assumed that the stress liner 6 has a tensile stress of 1.3 gigapascal (GPa) as an intrinsic stress. In the figure, the region surrounded by a white dotted line represents the channel section, the region surrounded by a solid line represents the region subjected to a tensile stress, and the region surrounded by a dot-dashed line represents the region subjected to a compressive stress. A darker portion corresponds to a higher tensile or compressive stress.

Figures 29A, 29B, 29C, 29D:
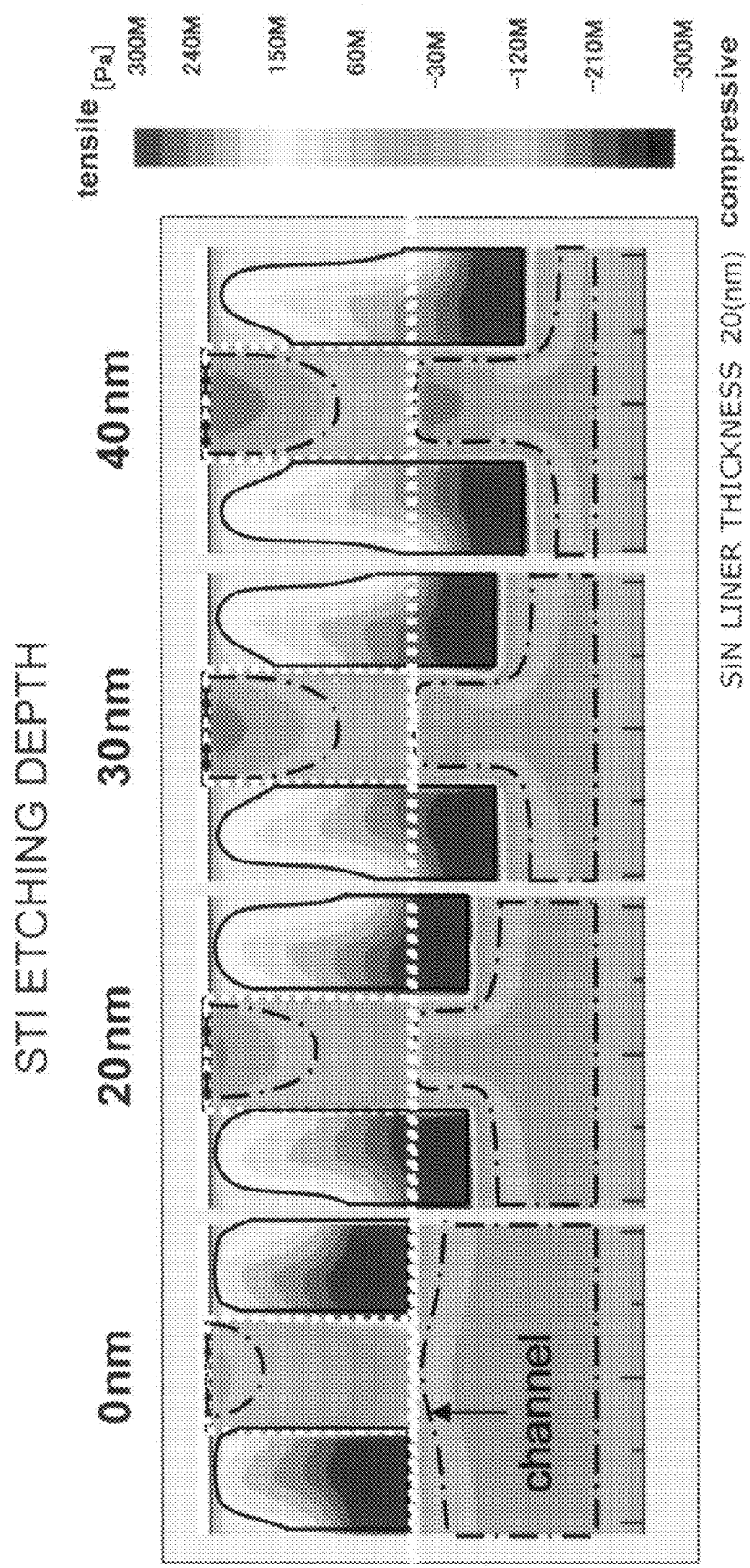
FIG. 29 shows a simulation result for stress distribution in the second direction y in the channel section for different values of etching depth d of the insulating layer where the stress liner has a thickness of 20 nanometers (nm).

FIG. 29A shows a stress distribution for an etching depth d of 0 nanometer (nm), that is, for the structure in FIG. 22.

FIG. 29B shows a stress distribution for an etching depth d of 20 nanometers (nm) which is equal to the stress liner thickness, that is, for the structure in FIG. 28.

FIGS. 29C and 29D show, respectively, a stress distribution for an etching depth d of 30 and 40 nanometers (nm), that is, for the structure in FIG. 27.

From this result in FIG. 29, as the etching depth d of the insulating layer 8 becomes larger, a compressive stress can be effectively applied to the channel section in the second direction y (the width direction of the semiconductor fin), and the carrier mobility can be enhanced.

Figure 30:
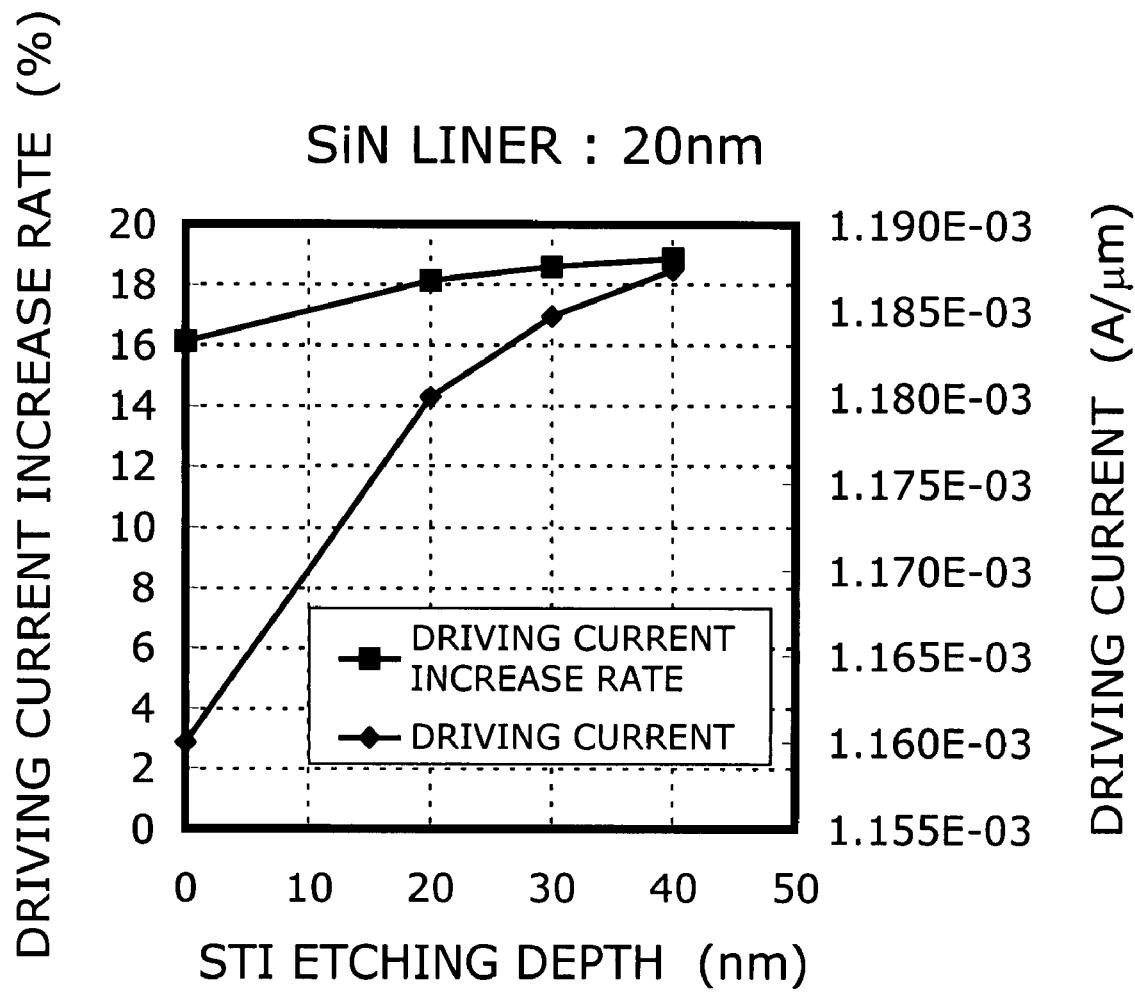
FIG. 30 is a graph illustrating the relationship of the driving current increase rate and the driving current to the etching depth d of the insulating layer where the stress liner has a thickness of 20 nanometers (nm).

FIG. 30 is a graph illustrating the relationship of the driving current increase rate and the driving current to the etching depth (the depth of the insulating layer 8 being recessed relative to the interface between the insulating layer 8 and the gate electrode 4) d of the insulating layer (STI) 8 where the stress liner 6 has a thickness of 20 nanometers (nm). The horizontal axis represents the etching depth d (nm) of the insulating layer 8, the left vertical axis represents the driving current increase rate (%) relative to the case where no stress liner 6 is used, that is, the case of zero stress, and the right vertical axis represents the driving current (A/μm).

From this result in FIG. 30, by causing the etching depth d of the insulating layer 8 to be larger than the stress liner thickness, the driving current and the driving current increase rate can be significantly increased.

On the other hand, in a p-type MOS, the carrier mobility is enhanced when the stress in the second direction y (the width direction of the semiconductor fin) is rather a tensile stress. Therefore, in a p-type MOS, it is preferable to prevent the compressive stress of the protruding portion 6a of the stress liner having a compressive stress as an intrinsic stress from acting on the channel section. Thus, also in a p-type MOS, the insulating layer 8 in contact with the protruding portion 6a of the stress liner 6 can be recessed relative to the interface between the insulating layer 8 and the gate electrode 4 to effectively apply a tensile stress to the channel section in the second direction y (the width direction of the semiconductor fin). Thus the carrier mobility can be enhanced, and the driving current can be increased.

FOURTH EMBODIMENT

Figure 31:
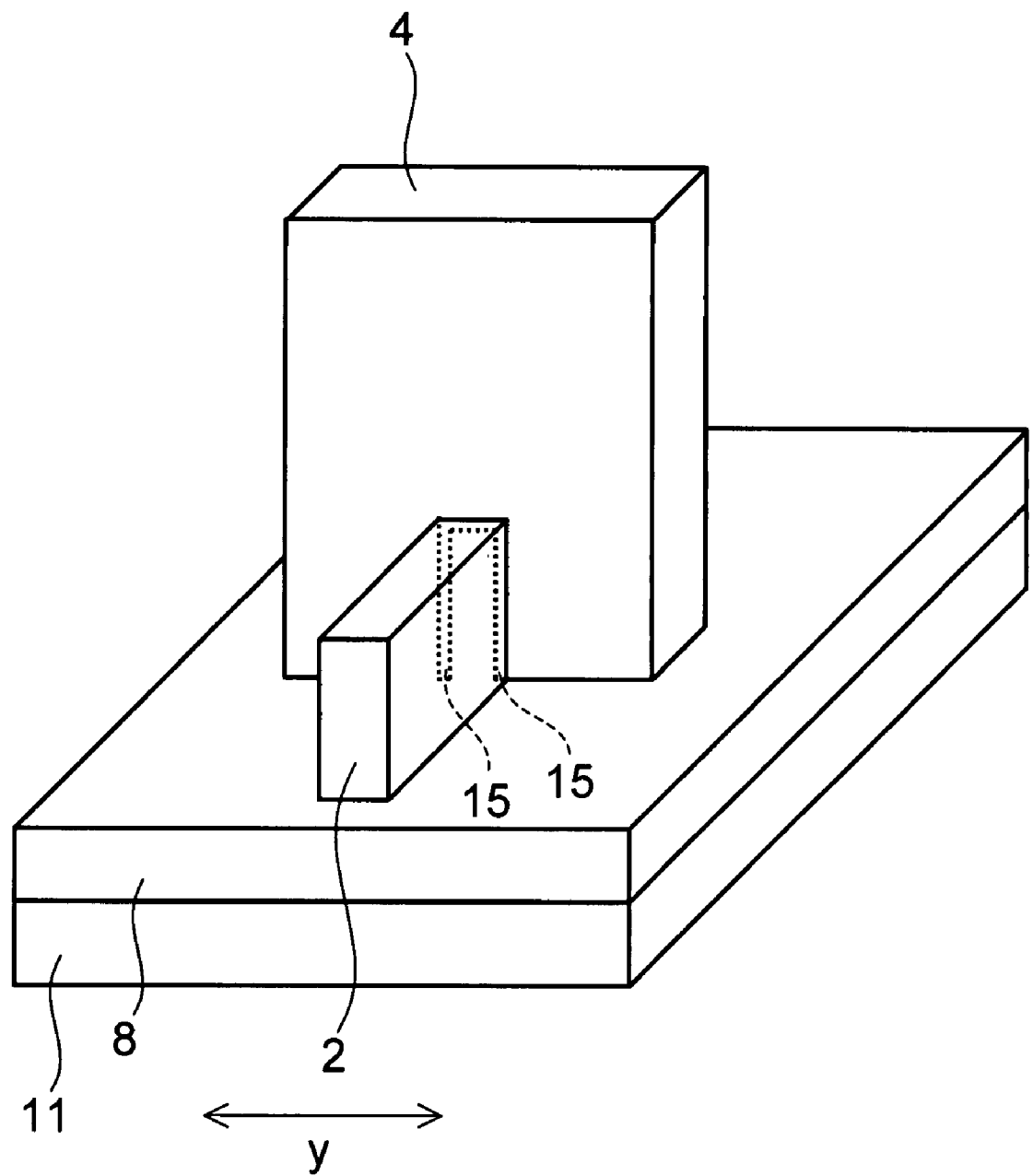
FIG. 31 is a schematic perspective view showing the positional relationship between the semiconductor fin and the gate electrode in a semiconductor device according to a fourth embodiment of the invention.

FIG. 31 is a schematic perspective view showing the positional relationship between the semiconductor fin 2 and the gate electrode 4 in a semiconductor device according to a fourth embodiment of the invention. This figure corresponds to FIG. 2 in the first embodiment described above.

In the structure of this embodiment, on both side faces and the upper face of the channel section in the semiconductor fin 2 is provided an insulating film 15, across which the gate electrode 4 is opposed to the channel section of the semiconductor fin 2. This is the so-called "tri-gate structure" where gate voltage application by the gate electrode 4 produces a channel on both side faces and the upper face of the semiconductor fin 2.

FIFTH EMBODIMENT

Figure 32:
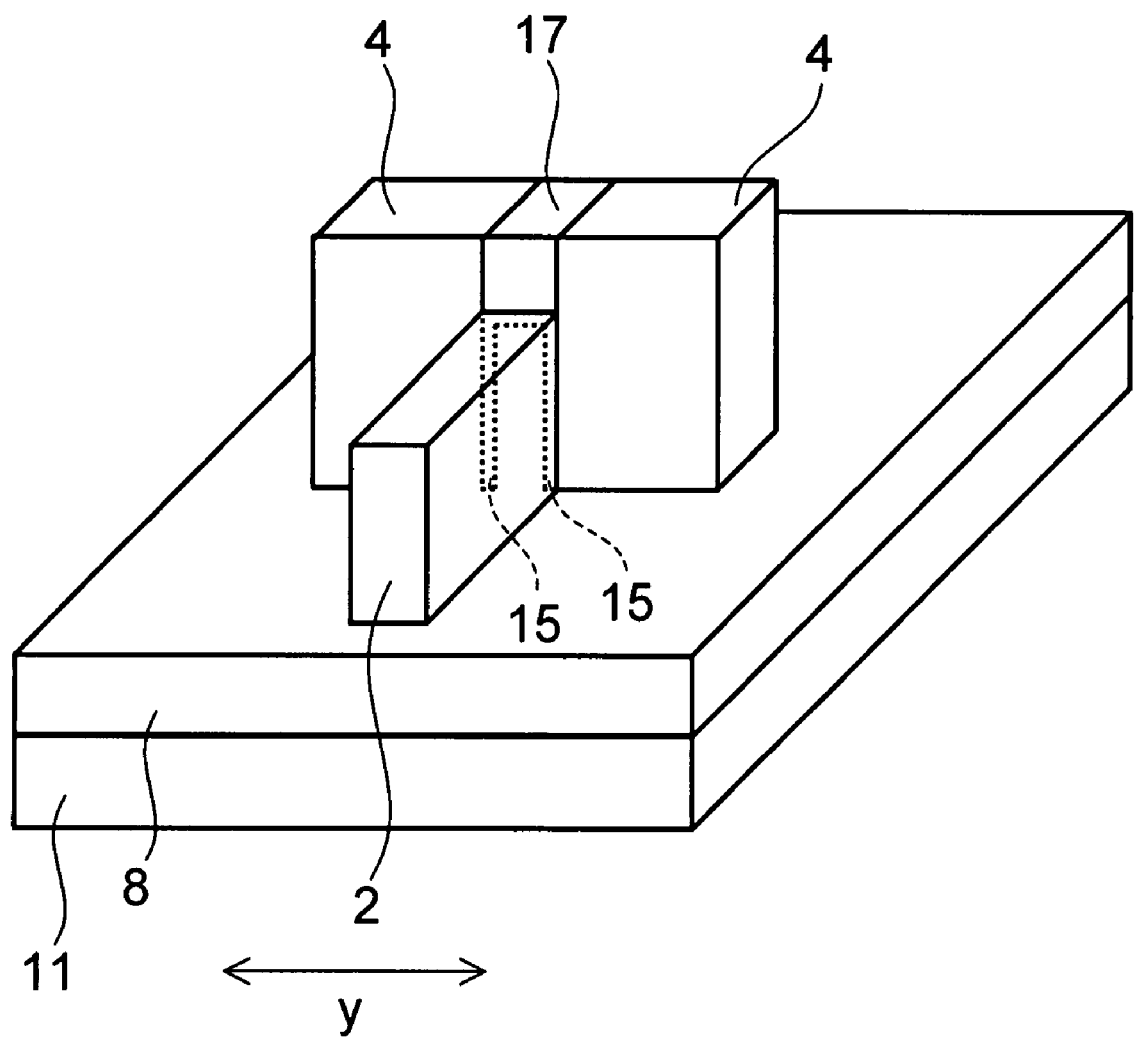
FIG. 32 is a schematic perspective view showing the positional relationship between the semiconductor fin and the gate electrode in a semiconductor device according to a fifth embodiment of the invention.

FIG. 32 is a schematic perspective view showing the positional relationship between the semiconductor fin 2 and the gate electrode 4 in a semiconductor device according to a fifth embodiment of the invention. This figure corresponds to FIG. 2 in the first embodiment described above.

In this embodiment, the gate electrode 4 is split into two by the semiconductor fin 2 and the insulating layer 17 as viewed in the second direction y, resulting in a "four-terminal structure" having a source electrode terminal, a drain electrode terminal, and two gate electrode terminals.

SIXTH EMBODIMENT

Figure 33:
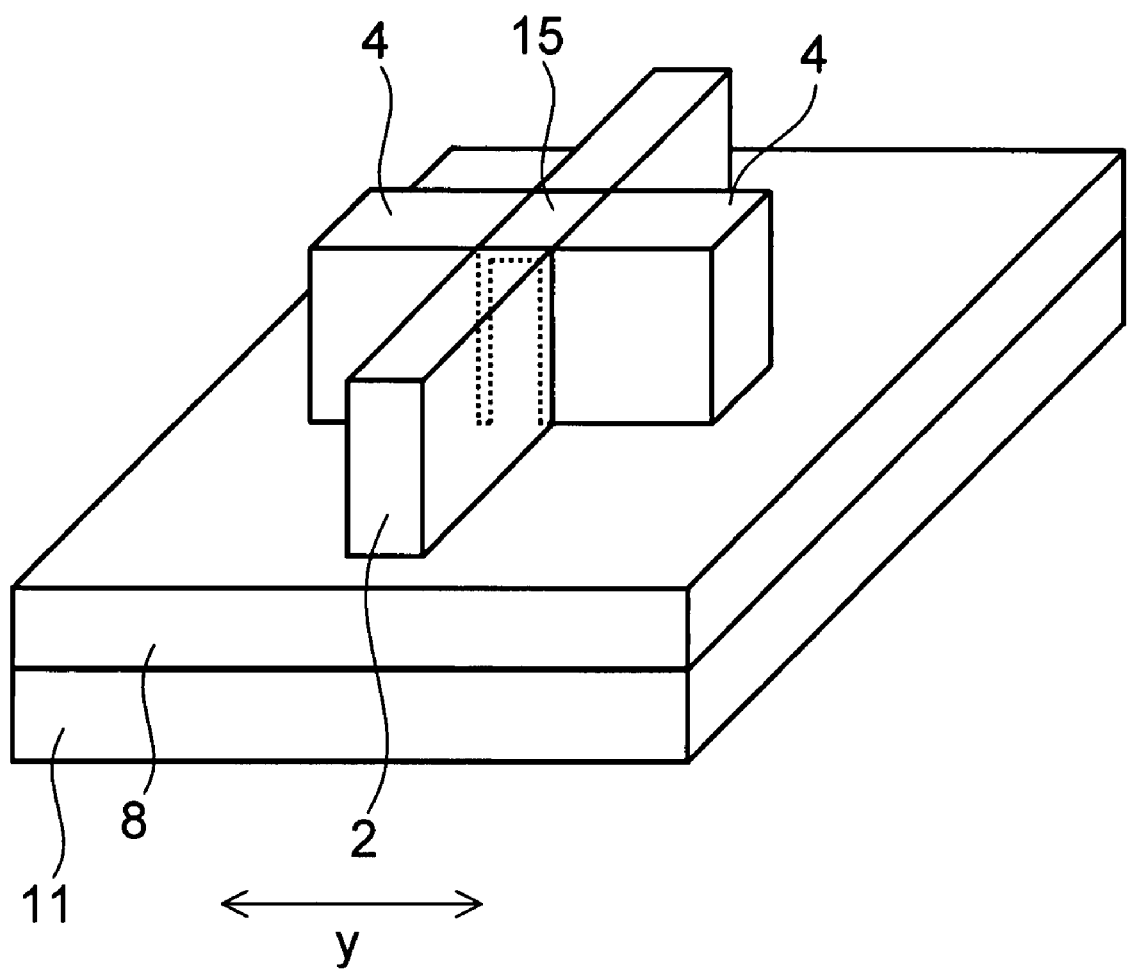
FIG. 33 is a schematic perspective view showing the positional relationship between the semiconductor fin and the gate electrode in a semiconductor device according to a sixth embodiment of the invention.

FIG. 33 is a schematic perspective view showing the positional relationship between the semiconductor fin 2 and the gate electrode 4 in a semiconductor device according to a sixth embodiment of the invention. This figure corresponds to FIG. 2 in the first embodiment described above.

This embodiment has a "four-terminal structure" where the gate electrode 4 is split into two in the second direction y like the fifth embodiment described above. However, the insulating layer 17 is not provided above the channel section of the semiconductor fin 2, but the insulating film 15 covers both side faces and the upper face of the channel section.

SEVENTH EMBODIMENT

Figure 34:
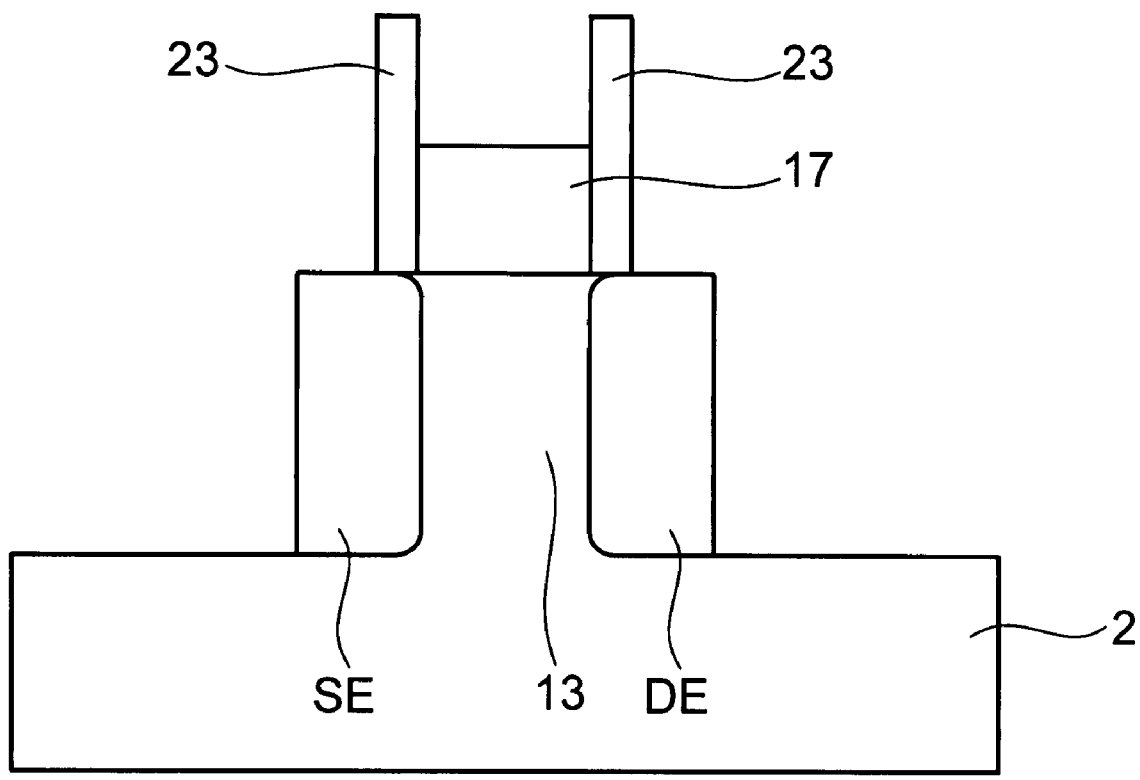
FIG. 34 is a process cross-sectional view illustrating the main part of a process of manufacturing a semiconductor device according to a seventh embodiment of the invention.
Figure 35:
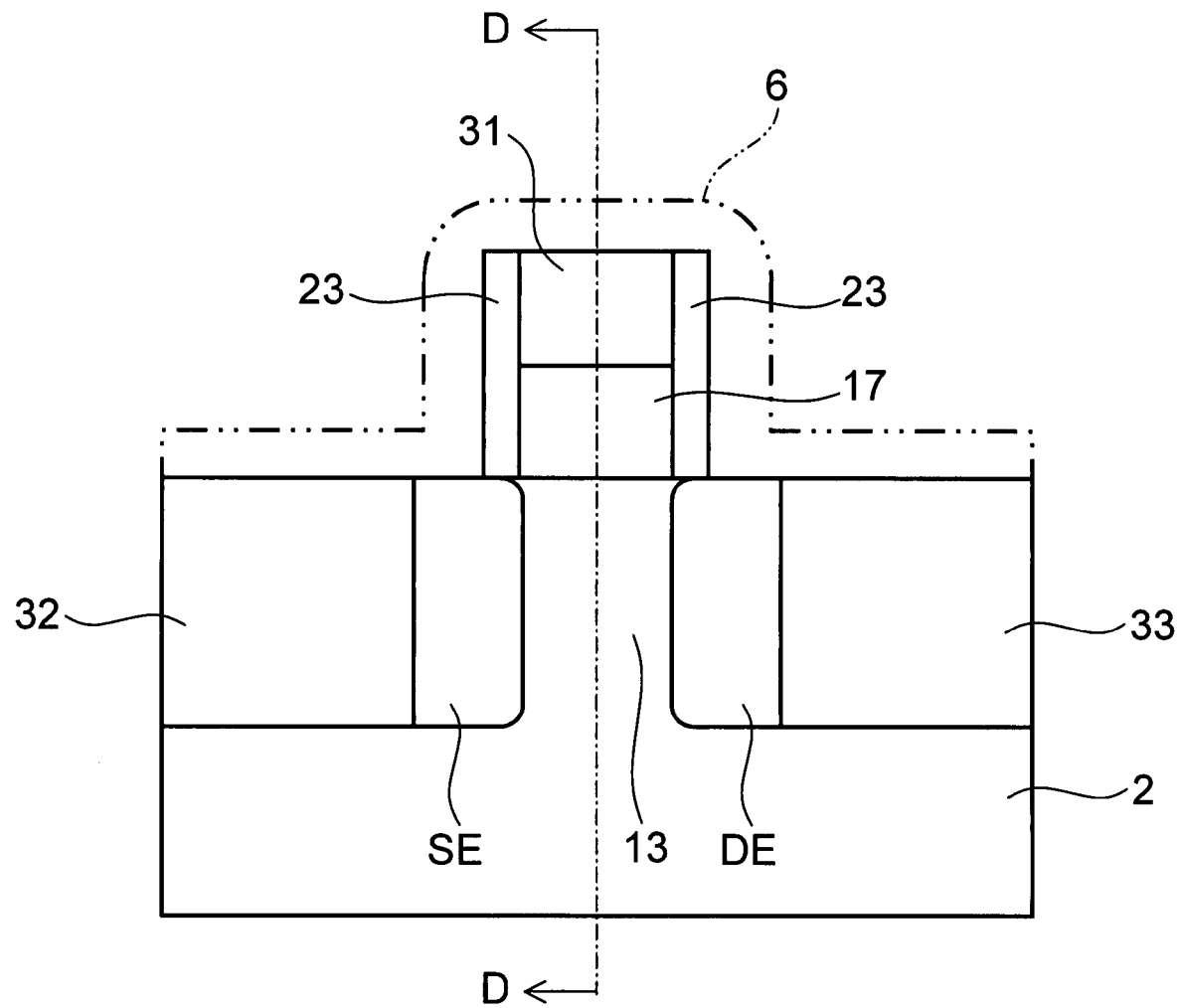
FIG. 35 is a process cross-sectional view continued from FIG. 34.
Figure 36:
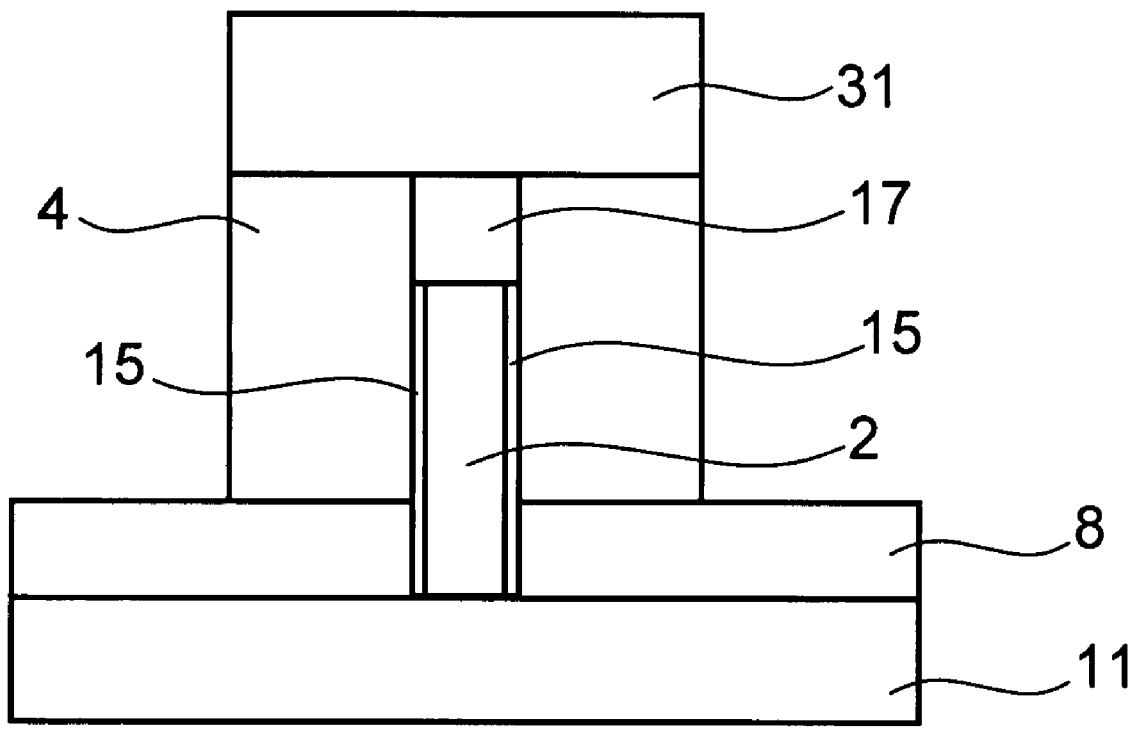
FIG. 36 is a cross-sectional view taken along D-D in FIG. 35.

FIGS. 34 to 36 are process cross-sectional views illustrating the main part of a process of manufacturing a semiconductor device according to a seventh embodiment of the invention, where FIG. 36 is a cross-sectional view taken along D-D in FIG. 35.

After the step shown in FIG. 11 described above with reference to the first embodiment, that is, after the source extension region SE and the drain extension region DE are formed, the RIE technique is illustratively used to remove the first sidewall insulating layer 23 on the side face of the insulating layer 19, the gate electrode (polysilicon) 4 on the insulating layer 17, part of the source extension region SE, and part of the drain extension region DE.

Subsequently, selective epitaxial growth of SiGe (silicon germanium) is conducted on the portion where the gate electrode (polysilicon) 4, the source extension region SE, and the drain extension region DE are removed.

As shown in FIGS. 35 and 36, this results in a structure where a source region 32 and a drain region 33 are made of SiGe (silicon germanium), and part of the gate electrode (the portion above the insulating layer 17) 31 is also composed of SiGe (silicon germanium). Subsequently, a stress liner 6 is formed to cover the insulating layer 17, the SiGe (silicon germanium) layer 31, the sidewall insulating layer 23, and the semiconductor fin 2. In this embodiment, the insulating layer 17 and the SiGe (silicon germanium) layer 31 constitute a spacer layer.

EIGHTH EMBODIMENT

Figure 37:
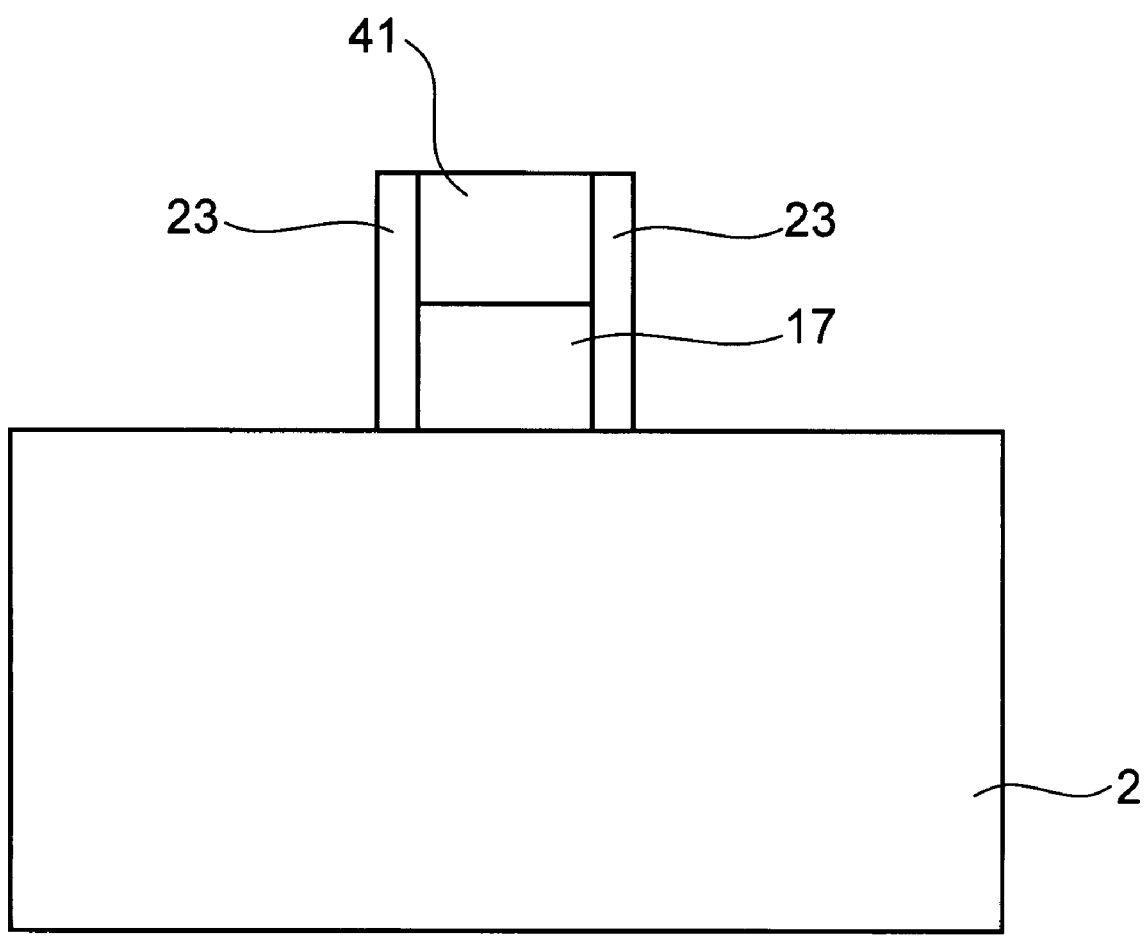
FIG. 37 is a process cross-sectional view illustrating the main part of a process of manufacturing a semiconductor device according to an eighth embodiment of the invention.
Figure 38:
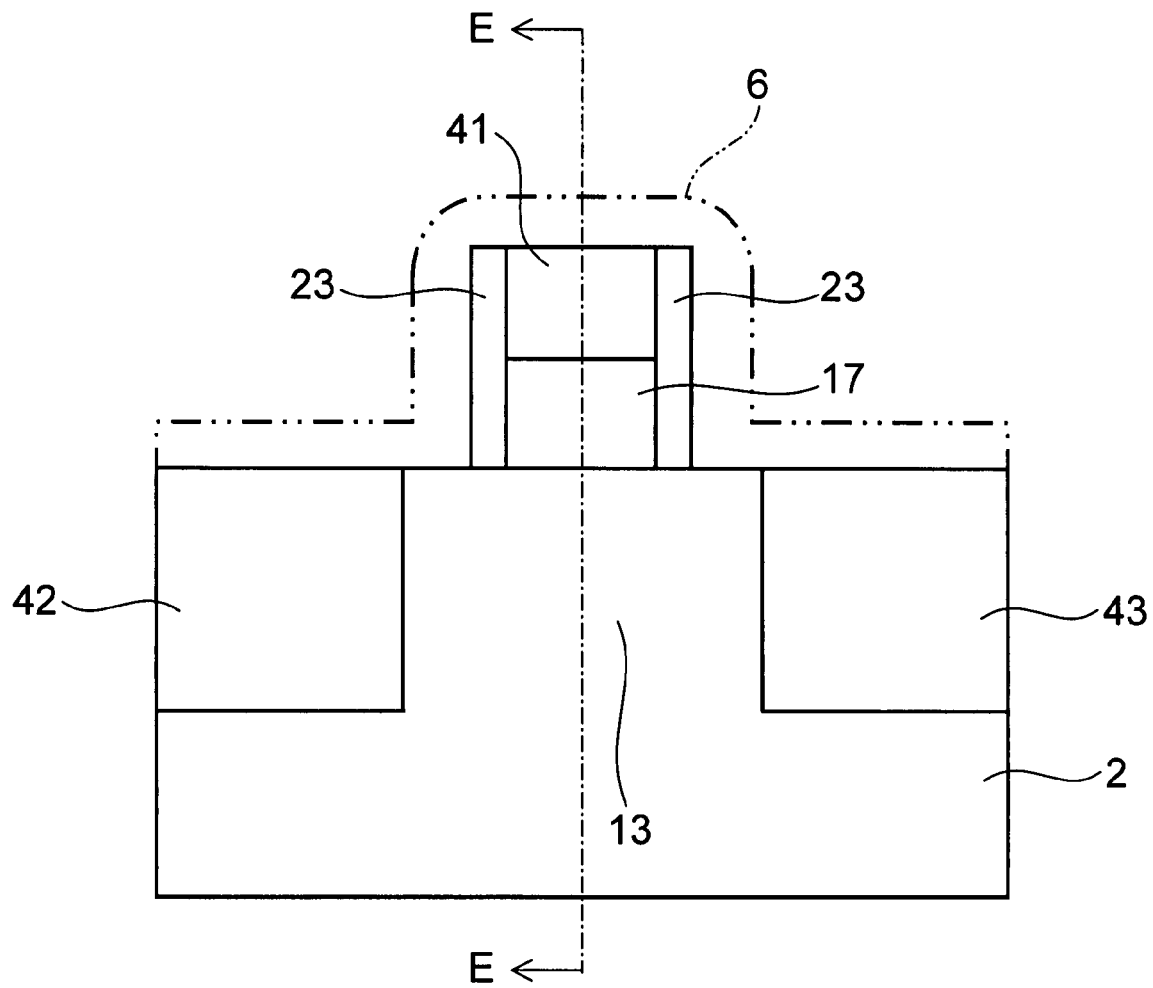
FIG. 38 is a process cross-sectional view continued from FIG. 37.
Figure 39:
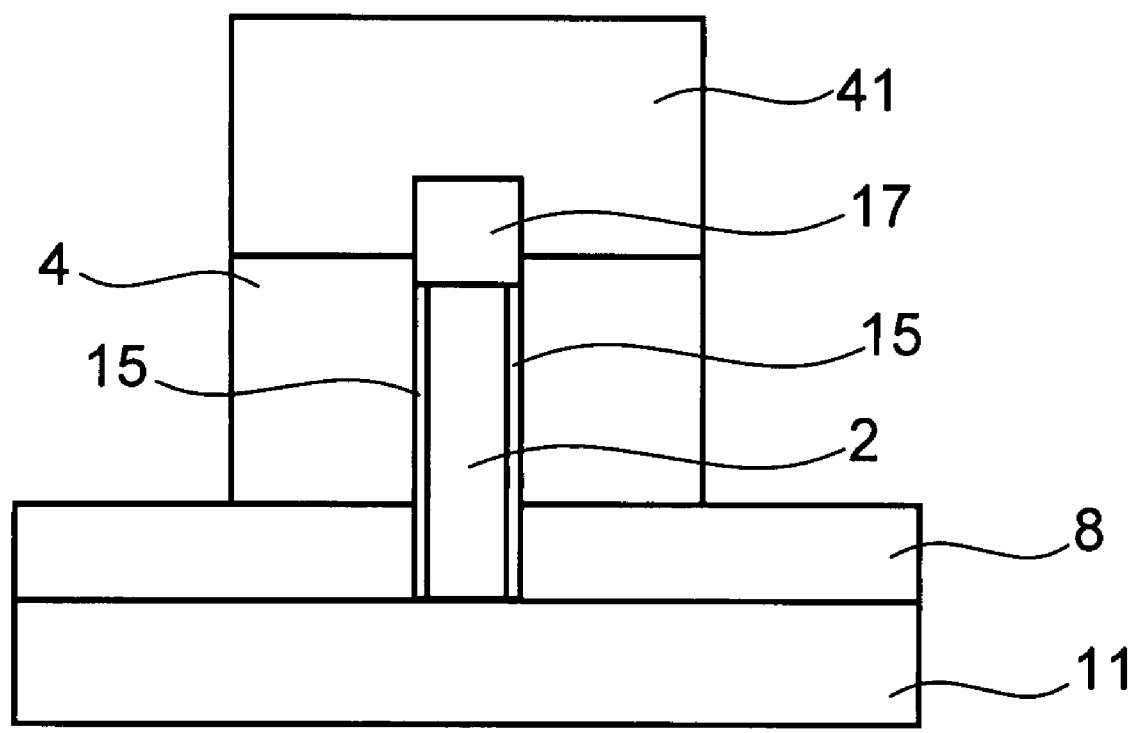
FIG. 39 is a cross-sectional view taken along E-E in FIG. 38.

FIGS. 37 to 39 are process cross-sectional views illustrating the main part of a process of manufacturing a semiconductor device according to an eighth embodiment of the invention, where FIG. 39 is a cross-sectional view taken along E-E in FIG. 38.

After the step shown in FIG. 10 described above with reference to the first embodiment, and before the source extension region SE and the drain extension region DE are formed by ion implantation, the surface portions of the semiconductor fin 2 to be turned into a source region and a drain region are silicidized with cobalt (Co) or nickel (Ni), for example. As shown in FIG. 38, this results in a source region 42 and a drain region 43 made of silicide such as NiSi or CoSi. Because the "FinFET" is based on a very thin semiconductor fin, the resistance of the source region and the drain region is not negligible. Thus, in the "FinFET", it is effective to reduce resistance by silicidizing the source region and the drain region as in this embodiment.

Alternatively, after the step shown in FIG. 10, the insulating layer 19 and the first sidewall insulating layer 23 on the side face thereof may be removed by e.g. RIE, and the gate electrode (polysilicon) 4 on the insulating layer 17 may be silicidized with cobalt (Co) or nickel (Ni), for example. Thus, as shown in FIG. 37, part of the gate electrode 41 is silicidized, and its resistance is reduced. Subsequently, as shown in FIG. 38, a stress liner 6 is formed to cover the insulating layer 17, the silicide layer 41, the sidewall insulating layer 23, and the semiconductor fin 2. In this embodiment, the insulating layer 17 and the silicide layer 41 constitute a spacer layer. As described above, FIG. 39 is a cross-sectional view taken along E-E in FIG. 38.

NINTH EMBODIMENT

Figure 40:
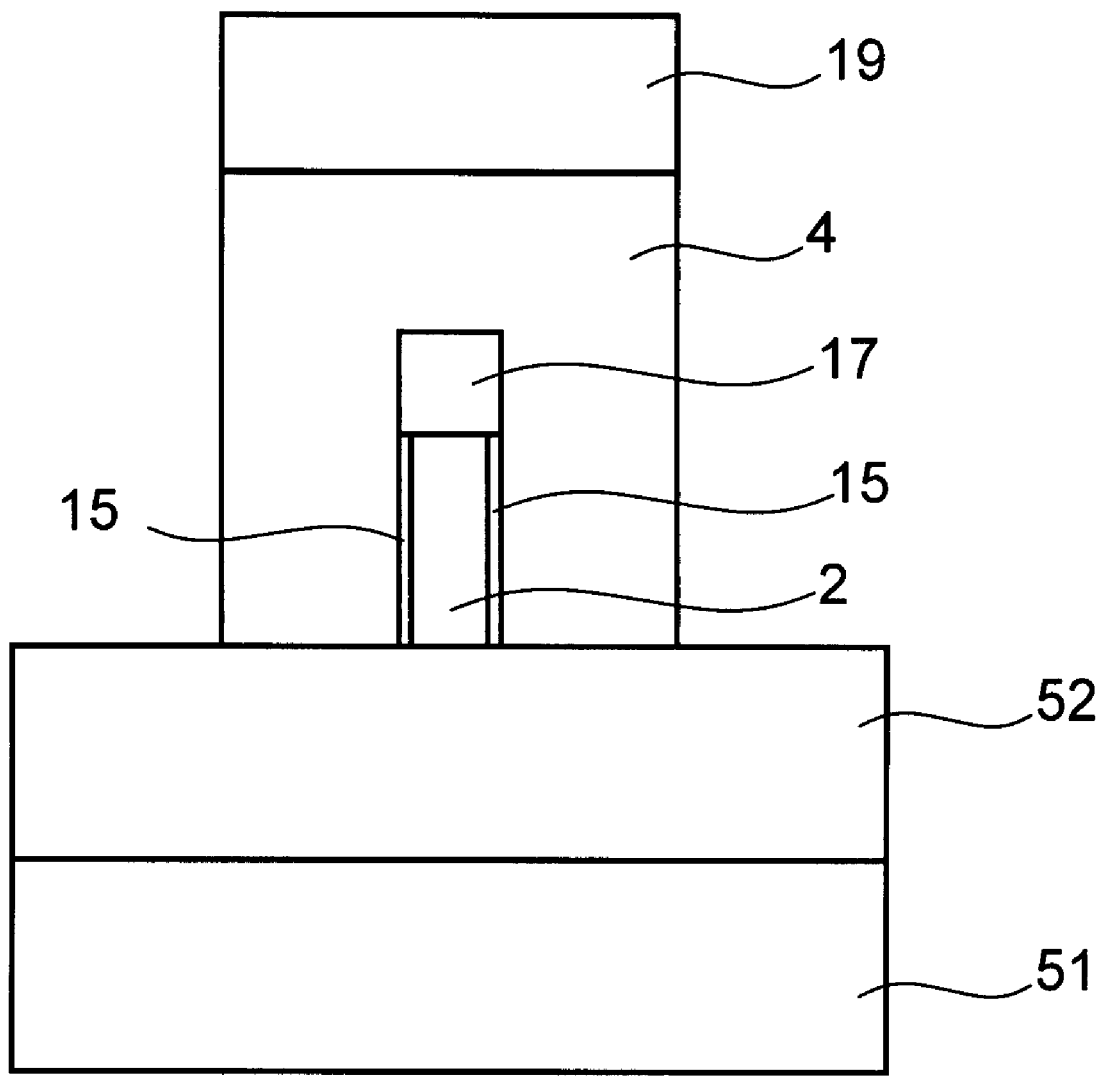
FIG. 40 is a schematic cross-sectional view of a semiconductor device according to a ninth embodiment of the invention, corresponding to FIG. 8.

FIG. 40 is a schematic cross-sectional view of a semiconductor device according to a ninth embodiment of the invention, corresponding to FIG. 8 in the first embodiment described above.

In this embodiment, a buried insulating layer (silicon oxide layer) 52 is provided on a semiconductor substrate 51 illustratively made of silicon. After an SOI (Silicon On Insulator) layer is formed on this buried insulating layer 52, this SOI layer is selectively etched to obtain a semiconductor fin 2.

The embodiments described above can be appropriately combined with each other as long as it is technically feasible, and such combinations are also encompassed within the scope of the invention.

For example, the first embodiment can be combined with the second embodiment. Specifically, the thickness t of the sidewall insulating layers in the first direction can be set to 45 nanometers (nm) or more, the gate height (the height of the spacer layer) h1 can be set to 105 nanometers (nm) or more, and simultaneously the protruding portion 6a of the stress liner 6 extending in the second direction y can be omitted. Then the carrier mobility in the channel section can be further enhanced, and the driving current can be further increased.

Likewise, the first embodiment can be combined with the third embodiment. Specifically, the thickness t of the sidewall insulating layers in the first direction can be set to 45 nanometers (nm) or more, the gate height (the height of the spacer layer) h1 can be set to 105 nanometers (nm) or more, and simultaneously the insulating layer 8 in contact with the protruding portion 6a of the stress liner 6 can be recessed relative to the interface between the insulating layer 8 and the gate electrode 4.

Figure 42:
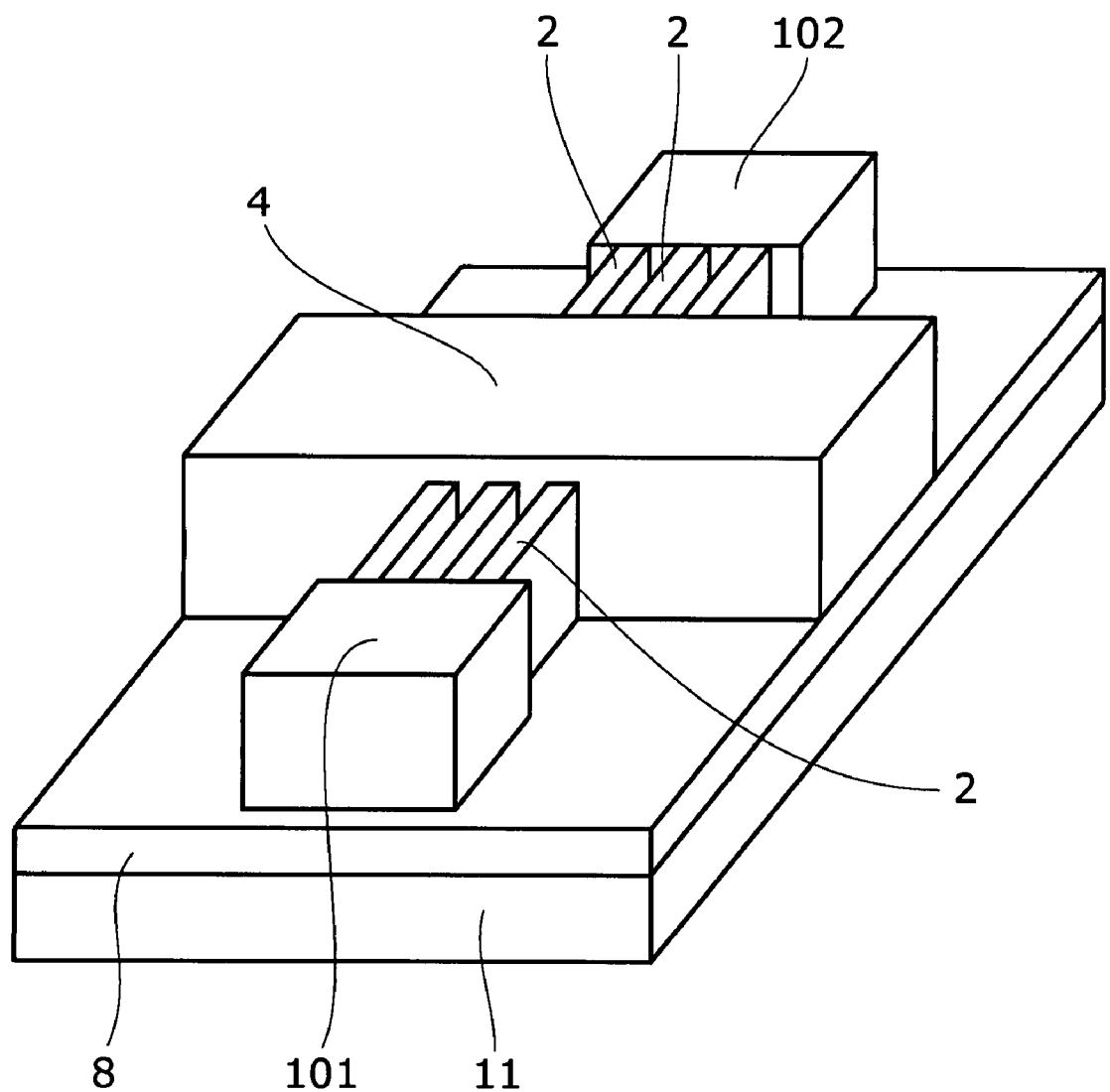
FIG. 42 is a schematic view showing the positional relationship between the semiconductor fins and the gate electrode in the semiconductor device according to the embodiment of the invention.

Furthermore, as shown in FIG. 42, a plurality of semiconductor fins 2 can be juxtaposed in parallel, and a gate electrode 4 can be provided to straddle the channel section of each of these semiconductor fins 2. Source regions of these fins 2 are connected to the source electrode 101, and drain regions of these fins 2 are connected to the drain electrode 102.

Furthermore, in any embodiment of the invention, the material of the stress liner 6 is not limited to silicon nitride, but can be silicon oxynitride, for example.

Furthermore, the spacer layer 21 may further include an insulating film which is provided at least one of on and under the intersecting part of the gate electrode 4 with the semiconductor fin 2.

The invention claimed is:

1. A semiconductor device comprising:
   an insulating layer;
   a semiconductor fin protruding from the insulating layer, extending in a first direction parallel to a major surface of the insulating layer, and having a source region, a channel section, and a drain region arranged in the first direction;
   a gate electrode opposed at least to a side face of the channel section in the semiconductor fin and extending in a second direction that is substantially orthogonal to the first direction and parallel to the major surface of the insulating layer;
   an insulating film interposed between the semiconductor fin and the gate electrode;

a spacer layer provided on the channel section;
a sidewall insulating layer provided adjacent to a side face of the spacer layer substantially parallel to the second direction; and
a stress liner covering the sidewall insulating layer and the spacer layer and having an intrinsic stress for distorting the semiconductor fin,
the sidewall insulating layer having a thickness of 45 nanometers (nm) or more in the first direction, and the spacer layer having a height of 105 nanometers (nm) or more.

2. The semiconductor device according to claim 1, wherein the stress liner is made of silicon nitride.

3. The semiconductor device according to claim 1, wherein the stress liner has a stronger intrinsic stress than that of the sidewall insulating layer.

4. The semiconductor device according to claim 1, wherein the source region and the drain region are n-type, and the stress liner applies a tensile stress acting on the channel section in a direction of a current flowing the channel section.

5. The semiconductor device according to claim 1, wherein the source region and the drain region are p-type, and the stress liner applies a compressive stress acting on the channel section in a direction of a current flowing the channel section.

6. The semiconductor device according to claim 1, wherein the gate electrode extends above the semiconductor fin, and the spacer layer includes a intersecting part of the gate electrode with the semiconductor fin.

7. The semiconductor device according to claim 6, wherein the spacer layer further includes an insulating film which is provided at least one of on and under the intersecting part of the gate electrode.

8. A semiconductor device comprising:
an insulating layer;
a semiconductor fin protruding from the insulating layer, extending in a first direction parallel to a major surface of the insulating layer, and having a source region, a channel section, and a drain region arranged in the first direction;
a gate electrode opposed at least to a side face of the channel section in the semiconductor fin and extending in a second direction that is substantially orthogonal to the first direction and parallel to the major surface of the insulating layer, an end portion of the gate electrode in the second direction being located at a distance that is substantially constant from a portion in contact with the insulating layer up to a portion at a height of an upper face of the semiconductor fin;
an insulating film interposed between the semiconductor fin and the gate electrode; and
a stress liner covering at least a side face of the gate electrode substantially parallel to the first direction and having an intrinsic stress for distorting the semiconductor fin,
the stress liner protruding no further from the side face of the gate electrode on the insulating layer in the second direction.

9. The semiconductor device according to claim 8, wherein the stress liner is made of silicon nitride.

10. The semiconductor device according to claim 8, wherein the source region and the drain region are n-type, and the stress liner applies a tensile stress acting on the channel section in a direction of a current flowing the channel section.

11. The semiconductor device according to claim 8, wherein the source region and the drain region are p-type, and the stress liner applies a compressive stress acting on the channel section in a direction of a current flowing the channel section.

12. The semiconductor device according to claim 8, wherein the source region and the drain region are n-type, and the stress liner applies a compressive stress acting on the channel section in a height direction.

13. The semiconductor device according to claim 8, wherein the source region and the drain region are p-type, and the stress liner applies a tensile stress acting on the channel section in a height direction.

14. A semiconductor device comprising:
an insulating layer;
a semiconductor fin protruding from the insulating layer, extending in a first direction parallel to a major surface of the insulating layer, and having a source region, a channel section, and a drain region arranged in the first direction;
a gate electrode opposed at least to a side face of the channel section in the semiconductor fin and extending in a second direction that is substantially orthogonal to the first direction and parallel to the major surface of the insulating layer, an end portion of the gate electrode in the second direction being located at a distance that is substantially constant from a portion in contact with the insulating layer up to a portion at a height of an upper face of the semiconductor fin;
an insulating film interposed between the semiconductor fin and the gate electrode; and
a stress liner covering at least a side face of the gate electrode substantially parallel to the first direction and having an intrinsic stress for distorting the semiconductor fin,
the stress liner protruding from the side face of the gate electrode on the insulating layer in the second direction, and
a portion of the insulating layer in contact with the protruding portion of the stress liner being recessed relative to the interface between the insulating layer and the gate electrode.

15. The semiconductor device according to claim 14, wherein the depth of the recessed portion of the insulating layer is larger than the thickness of the stress liner.

16. The semiconductor device according to claim 14, wherein the stress liner is made of silicon nitride.

17. The semiconductor device according to claim 14, wherein the source region and the drain region are n-type, and the stress liner applies a tensile stress acting on the channel section in a direction of a current flowing the channel section.

18. The semiconductor device according to claim 14, wherein the source region and the drain region are p-type, and the stress liner applies a compressive stress acting on the channel section in a direction of a current flowing the channel section.

19. The semiconductor device according to claim 14, wherein the source region and the drain region are n-type, and the stress liner applies a compressive stress acting on the channel section in a height direction.

20. The semiconductor device according to claim 14, wherein the source region and the drain region are p-type, and the stress liner applies a tensile stress acting on the channel section in a height direction.

* * * * *